US012211677B2

(12) United States Patent
Nagorny et al.

(10) Patent No.: US 12,211,677 B2
(45) Date of Patent: Jan. 28, 2025

(54) UNIFORMITY CONTROL FOR PLASMA PROCESSING

(71) Applicant: Applied Materials, Inc., Santa clara, CA (US)

(72) Inventors: Vladimir Nagorny, Tracy, CA (US); Rene George, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 682 days.

(21) Appl. No.: 17/382,332

(22) Filed: Jul. 21, 2021

(65) Prior Publication Data
US 2023/0033827 A1    Feb. 2, 2023

(51) Int. Cl.
*H01J 37/32* (2006.01)
*G06N 20/00* (2019.01)

(52) U.S. Cl.
CPC ........ *H01J 37/32926* (2013.01); *G06N 20/00* (2019.01); *H01J 37/32183* (2013.01); *H01J 37/32449* (2013.01)

(58) Field of Classification Search
CPC ........... H01J 37/32926; H01J 37/32183; H01J 37/32449; H01J 37/32146; H01J 37/32082; H01J 37/32091; G06N 20/00; G06N 3/0442; G06N 3/0464; G06N 3/084; G06N 3/09; H01L 21/3065
See application file for complete search history.

(56) References Cited

U.S. PATENT DOCUMENTS

| 6,213,050 B1 | 4/2001 | Liu et al. |
| 7,070,657 B1 * | 7/2006 | Cheung ................... G03F 7/091 |
| | | 156/345.24 |
| 7,601,651 B2 | 10/2009 | Balseanu et al. |
| 2001/0002584 A1 | 6/2001 | Liu et al. |

(Continued)

FOREIGN PATENT DOCUMENTS

| JP | H09118600 A | 5/1997 |
| JP | 2012169629 A | 9/2012 |

(Continued)

OTHER PUBLICATIONS

International Search Report and Written Opinion for the International Application No. PCT/US2022/026581, mailed on Aug. 23, 2022, 9 pages.

*Primary Examiner* — Alicia M. Choi
(74) *Attorney, Agent, or Firm* — Lowenstein Sandler LLP

(57) ABSTRACT

A system and method including a processing device. The processing device receives data including one or more plasma exposure durations of a plasma process. The plasma exposure duration are associated with a set of controlled elements. The processing device causes a each set of controlled elements to switch between a first mode of operation and a second mode of operation. Each set of controlled elements expose appropriate portion of a substrate to the plasma related fluxes. The first set of controlled elements process the substrate at an increased rate while operating in the first mode of operation relative to the second mode of operation. The processing device causes each set of con- (Continued)

trolled elements to operate in the first mode of operation for the appropriate time duration based on the received plasma exposure duration data.

20 Claims, 12 Drawing Sheets

(56) References Cited

U.S. PATENT DOCUMENTS

| | | | | |
|---|---|---|---|---|
| 2003/0056901 A1* | 3/2003 | Nakano | ............ | H01J 37/32082 156/345.47 |
| 2004/0241946 A1* | 12/2004 | Kim | ................. | H01L 21/76895 257/E21.59 |
| 2005/0194548 A1* | 9/2005 | Quach | ............... | H01L 21/67115 250/443.1 |
| 2016/0148787 A1 | 5/2016 | Burgess et al. | | |
| 2016/0218012 A1 | 7/2016 | Shimamoto et al. | | |
| 2019/0088523 A1 | 3/2019 | Matsuyama et al. | | |
| 2019/0157039 A1* | 5/2019 | Riggs | ........................ | G06F 1/12 |
| 2019/0259674 A1 | 8/2019 | Howald et al. | | |
| 2020/0144028 A1* | 5/2020 | Nagami | ............ | H01J 37/32577 |
| 2021/0193474 A1* | 6/2021 | Tan | ..................... | H01J 37/32174 |
| 2021/0216875 A1* | 7/2021 | He | ........................... | G06N 3/10 |
| 2023/0154728 A1* | 5/2023 | Wu | ................... | H01L 21/31122 438/714 |
| 2023/0229133 A1* | 7/2023 | Lo | ..................... | H01L 21/67196 438/798 |

FOREIGN PATENT DOCUMENTS

| | | |
|---|---|---|
| JP | 2016001638 A | 1/2016 |
| JP | 2016162795 A | 9/2016 |
| JP | 2019169627 A | 10/2019 |
| JP | 2019186487 A | 10/2019 |
| JP | 2019-216086 A | 12/2019 |
| KR | 10-2250368 B1 | 5/2021 |
| WO | 2021/154747 A1 | 8/2021 |

* cited by examiner

UNIFORMITY CONTROL FOR PLASMA PROCESSING

TECHNICAL FIELD

Some embodiments of the disclosure relate, in general, to digital control of plasma processing. Embodiments additionally relate to systems, devices, and methods for plasma delivery and/or plasma processing.

BACKGROUND

Plasma processing is widely used in the semiconductor industry. Plasma can modify a chemistry of a processing gas (e.g., generating ions, radicals, etc.), creating new species, without limitations related to the process temperature, generating a flux of ions to the wafer with energies from a small fraction of an electronvolt (eV) to thousands of eVs. There are many kinds of plasma sources (e.g., capacitively coupled plasma (CCP), inductively coupled plasma (ICP), microwave generated plasma, electron cyclotron resonance (ECR), and the like) that cover a wide operational process range from a few mTorr to a few Torr.

A common plasma process specification today is a high uniformity of the process result (e.g., a uniformity across a wafer up to the very edge of the wafer). This standard is often very difficult to achieve, because it involves many factors, many of which interfere with others. Plasma uniformity, chamber design, wafer temperature distribution, design of the bias electrode, etc. are only part of those factors. To satisfy these criteria, one designs both RF antennas and processing chambers to achieve the highest level of process uniformity. This often leads to large dimensions of a chamber and power generators (e.g., antennas, coils, electrodes, etc.), large overall plasma volume, and other expensive measures, like complex temperature control, coil splitting magnetic field screens, etc. While basic process uniformity within a few percent can be fixed by a general tool design, even these measures are often inadequate, when uniformity criteria become stricter. A chamber then has to be equipped with elements that can allow individual tuning of the chamber for specific processes. In addition, large plasma volume by itself may be a problem for processes that require quick change of chemistry.

One can observe a parallel between plasma processing and TV. Originally TV was based on Cathode Ray Tube (CRT) technology, where an electron beam scans horizontally and vertically inside a vacuum tube exciting phosphor dots on the front panel of the tube, making about 25 frames per second. Each phosphor dot flashes light for a short (fixed) time and the brightness of this flash is controlled by the electron beam current. Then a receptor (e.g., an eye) integrates for a brief time duration and averages the brightness of light coming from every phosphor dot. The color of the dot is determined by the ratio of average brightness of neighboring color dots and the brightness is by an overall intensity of the light from these dots. The analog nature of CRT image control is in the control of intensity of the electron beam, or in the peak brightness of every light flash. CRT and other analog systems reveal challenges of maintaining specific process specification (e.g., power requirements, chamber size, element specification limitation, etc.) due to the strict specification requirements to perform the process. Like CRT, analog systems generally often lack the flexibility demanded by modern innovation in various fields of process control. For this reason analog system are often manufactured with a specialized specification to perform a specific narrow range of processes.

Growing problems with CRT technology were resolved by switching to a digital technology, which of course required changing both the hardware, the signal and the signal control. Apparently, to switch analog technology to a digital one in plasma processing, one will have to change both—hardware and control.

SUMMARY

In an example embodiment, a method includes receiving, by a processing device, data indicative of one or more plasma exposure durations associated with a plasma process. Each of the one or more plasma exposure durations may be associated with a set of controlled elements. The processing device may cause a first set of controlled elements to switch between a first mode of operation and a second mode of operation. The first set of controlled elements exposes a first portion of a substrate to plasma related fluxes. The first plurality of controlled elements process the substrate at an increased rate while operating in the first mode of operation relative to the second mode of operation. The processing device may cause the first plurality of controlled elements to operate in the first mode of operation for a first time duration based on the data.

In an example embodiment, a system includes a processing chamber and a set of controlled elements disposed within the processing chamber. The set of controlled elements expose a surface of a substrate disposed within the processing chamber to plasma related fluxes. The system may include a processing device communicatively coupled to the set of controlled elements and configured to control the plurality of controlled elements. The processing device may be configured to receive data indicative of one or more plasma exposure duration of a plasma process. One or more plasma exposure durations may each be associated with a set of controlled elements. The processing device may cause a first selection of the set of controlled elements to switch between a first mode of operation and a second mode of operation. The first selection of the set of controlled elements expose a first portion of a surface of the substrate to plasma related fluxes. The first selection of the set of controlled elements may process the substrate at an increased rate while operating in the first mode of operation relative to the second mode of operation. The processing device may cause the first plurality of controlled elements to operate in the first mode of operation for a first time duration based on the data.

In an example embodiment, a method includes receiving, by a processing device, data indicative of one or more plasma exposure durations each associated with a plurality of controlled elements configured to expose a substrate to plasma related fluxes associated with a plasma process. The processing device may receive the first thickness profile including a first set of process result thickness values of the substrate measured after exposing the substrate to the plasma related fluxes associated with a first plurality of controlled elements operating in a first mode for a first plasma exposure duration. The processing device may determine a first plurality of substrate processing rate associated with one or more locations across a surface of the substrate corresponding to the set of controlled elements operating in the first mode of operation. The processing device may modify by the processing device the data by changing one of the one or more plasma exposure duration responsive to determining the first plurality of substrate processing rates and the second plurality of substrate processing rates.

BRIEF DESCRIPTION OF THE DRAWINGS

The disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
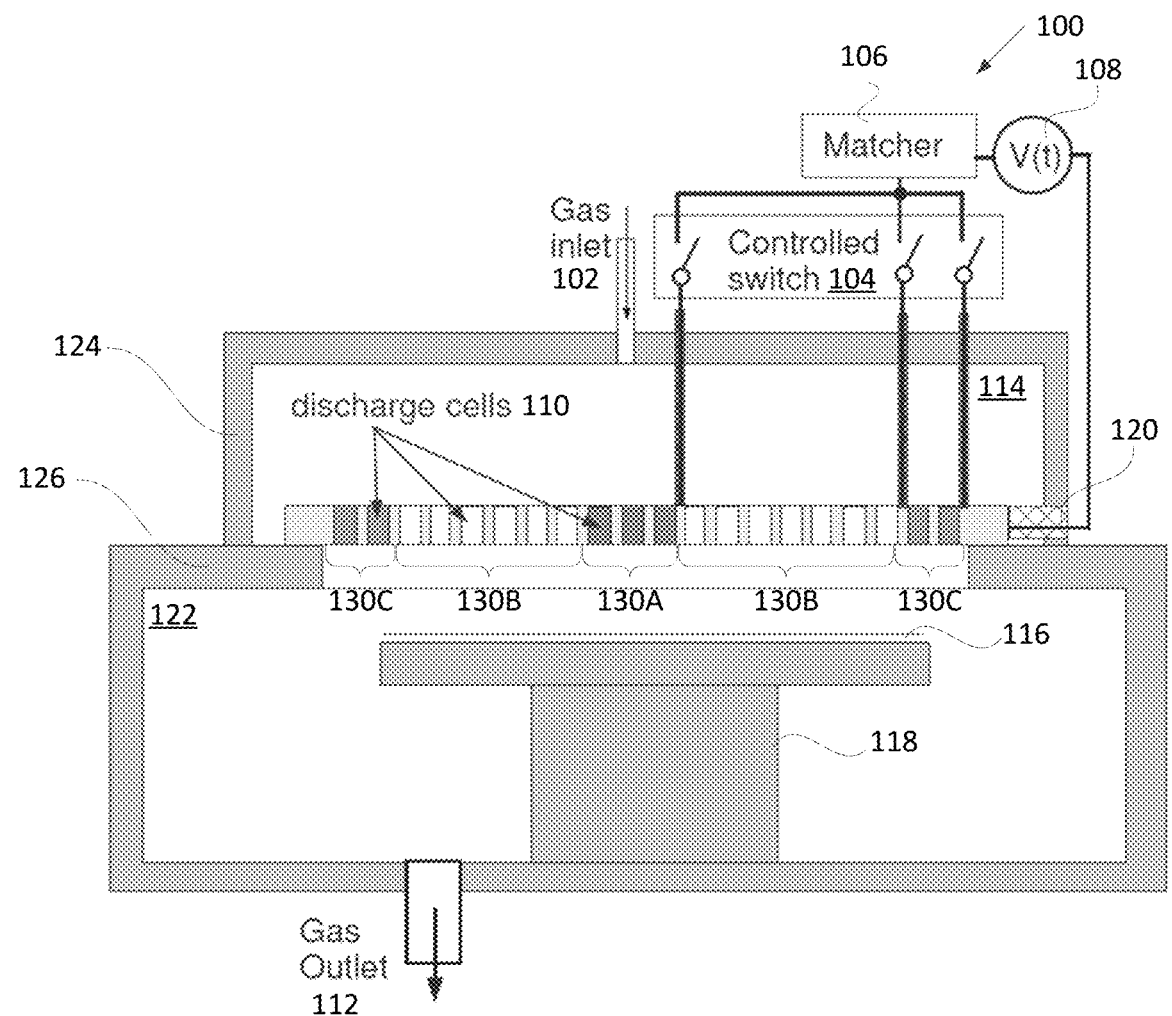
FIG. 1 illustrates a plasma processing system, according to aspects of the disclosure.

Process uniformity control is challenging problem in semiconductor processing. Semiconductor processing often involves multiple parameters that affect results across the substrate. Process uniformity is often very difficult to achieve. Process uniformity can involve many factors, many of which interfere with others. For example, plasma uniformity, chamber design, wafer temperature distribution, design of the bias electrode, etc. are only part of those factors. Radio frequency (RF) antennas and processing chambers are often manufactured and assembled to achieve the highest level of process uniformity. This often leads to large dimensions of a chamber and power generators (e.g., antennas, coils, electrodes, etc.), large overall plasma volume, and other expensive measures, like complex temperature control, coil splitting, magnetic field screens, etc. The control and relationship between each of these factors is difficult and not obvious.

Conventionally, the approach to the overcoming the process uniformity challenge is attempting to make all of those parameters uniform across the wafer (e.g., uniform fluxes, uniform reaction rates on the wafer). Actual fluxes of every species during a process are difficult to track and measure, and as a result process uniformity is often misleading. A uniform result is may not be a result of having uniform parameters across all species of fluxes but rather that action of some non-uniformities (e.g., fluxes of a certain species) are compensated by actions of other non-uniformities. For example, by changing the film of the substrate, the same plasma/gas producing uniform result on the first film, may produce a non-uniform result on the second film. This may be result because a relative reactivity of the second film to incoming species may be different from that of the first film. The above example shows that uniformity tuning is unique for any given process and/or equipment setup.

However, the devices, systems, and/or methodology disclosed herein provide a different approach to plasma processing and uniformity tuning. The problems of uniformity tuning can be mitigated, and in some cases eliminated when used in a time-based operating paradigm. The result of a process on a substrate (e.g., uniform or non-uniform) grows with time, whether it is removing, depositing, and/or growing material of treating. For example, a process etches deeper, deposits get thicker, and the like occur over time. Controlling any particular area of a substrate using time exposure, rather than local density of incoming fluxes, allows any non-uniformity to be easily compensated by applying these fluxes for different time durations. A method of controlling local exposure to processing fluxes may include using multiple local sources (e.g., controlled elements) associated with these fluxes.

To control local exposure to process flux, multiple local sources of these fluxes can be used. For example, a plasma source may comprise an array of tens or hundreds of small plasma sources placed to the substrate that fits this requirement. Local wafer exposure to plasma can be controlled by grouping the sources into zones and running these sources (or zones) for different time durations (e.g., ON/OFF, ON1/ON2). Fluxes generated by a zone of sources operating in a first operational mode (e.g., ON state) can be independent of the mode of operation of the remaining zones with the all other sources. For example, fluxes generated by a first zone of sources in the ON state may not depend on the state of all other zones of sources.

In some embodiments, to manage time t(x, y) at a target or threshold precision, the proposed sources can use digital methodology that includes splitting the process time into a number of subfields, each having exposure durations for which sources are activated or switched between a higher process rate mode of operation and a lower process rate mode of operation (e.g., ON1/ON2) Sources in the lower process rate mode of operation (e.g., ON2 or OFF) state may not generate plasma and plasma related fluxes. This binary approach may be used for local fluxes $\Phi(x, y, t)$ (e.g., ON/OFF independent on other sources) and digital time control. A binary approach to fluxes can allow for a greater precision of control compared to conventional multiple parameter balancing techniques.

In some embodiments (e.g., equipment restrictions, precision thresholds below a target threshold, process complexity below a threshold complexity, etc.), neither binary control of flux sources (ON/OFF or ON1/ON2), nor digital version of the time control are necessary for realizing time control of the wafer exposure. While binary approach is convenient, attaining fixed flux in an OFF state may not be compatible with all plasma process conditions. The realization of the binary approach may require complicated and expensive measures that may only be practically viable for very demanding applications.

Embodiments of the disclosure provide for devices, methods, and systems that employ independently controlled plasma sources capable of be raised to a high operational mode or a low operational mode. For example, ON/OFF is a specific type of this mode (e.g., a first source is ON, the rest are OFF or first source is OFF, the rest are ON). Embodiments disclosed herein are directed to devices, systems, and processes for controlling a plasma process through time dependent exposure of plasma related fluxes by controlled elements using local two level control of grouped sources (e.g., zone control).

In an example embodiment, a method includes receiving, by a processing device, data indicative of one or more plasma exposure duration of a plasma process. Each of the one or more plasma exposure durations may be associated with a set of controlled elements (e.g., plasma sources). The processing device may cause a first set of controlled elements to switch between a first mode of operation (e.g., ON/ON1, a high power mode, increased flux generation mode) and a second mode of operation (e.g., OFF/ON2, a lower power mode, a reduced flux generation mode). The first set of controlled elements exposes a first portion of a substrate to plasma related fluxes. The first plurality of controlled elements process the substrate at an increased rate (e.g., increase rate of deposition growth, etch depth, annealing thickness, etc.) while operating in the first mode of operation relative to the second mode of operation. The processing device may cause the first plurality of controlled elements to operate in the first mode of operation for a first time duration based on the data.

In an example embodiment, a system includes a processing chamber and a set of controlled elements disposed within the processing chamber. The set of controlled elements expose a surface of a substrate disposed within the processing chamber to plasma related fluxes. The system may include a processing device, communicatively coupled to the set of controlled elements (e.g., plasma sources, actuators, heat sources, etc.) and configured to control the plurality of controlled elements. The processing device may be configured to receive data indicative of one or more plasma exposure durations of a plasma process (e.g., annealing, deposition, etching, etc.). One or more plasma exposure duration may each be associated with a set of controlled elements. The processing device may cause a first selection of the set of controlled elements to switch between a first mode of operation and a second mode of operation. The first selection of the set of controlled elements expose a first portion of a surface of the substrate to plasma related fluxes. The first selection of the set of controlled elements processes the substrate at an increased rate while operating in the first mode of operation relative to the second mode of operation. The processing device may cause the first plurality of controlled elements to operate in the first mode of operation for a first time duration based on the data.

In an example embodiment, a method includes receiving, by a processing device, data indicative of one or more plasma exposure durations each associated with a plurality of controlled elements configured to expose a substrate to plasma related fluxes associated with a plasma process. The processing device may receive the first thickness profile including a first set of process result thickness values of the substrate measured after exposing the substrate to the plasma related fluxes associated with a first plurality of controlled elements operating in a first mode for a first plasma exposure duration. The processing device may receive a second thickness profile of the substrate profile including a second set of process result thickness values of the substrate measured after exposing the substrate to the plasma related fluxes associated with a first plurality of controlled elements operating in a first mode for a second plasma exposure duration. The processing device may determine a first plurality of substrate processing rate associated with one or more locations across a surface of the substrate associated with the set of controlled elements operating in the first mode of operation. The processing device may modify by the processing device the data by changing one of the one or more plasma exposure duration responsive to determining the first plurality of substrate processing rates and the second plurality of substrate processing rates.

FIG. 1 illustrates a plasma processing system 100, according to aspects of the disclosure. The plasma processing system 100 may include a processing chamber 122 and a plasma source 114 The plasma source includes walls 124 (e.g., to hold the atmospheric pressure), a gas inlet 102, the gas distribution volume limited by the walls, the plasma generating panel 120, containing multiple controlled elements (e.g., discharge cells 110) which generate plasma when the same voltage V(t) (e.g., constant voltage) is applied to all cells of the panel 120. The processing chamber 122 may be one or more of an etch chamber, a deposition chamber (including a chamber for atomic layer etch/deposition, chemical vapor deposition, physical vapor deposition, or plasma enhanced versions thereof), an anneal chamber, a photoresist strip chamber and/or the like. Processing chamber 122 include walls 126 that holds inside vacuum and provides support to the plasma source 114, substrate support 118, and gas outlet 112 and may include features described in association with processing chambers in other embodiments. The gas inlet 102 and gas outlet 112 may provide a flow of feed gas through the processing system under the processing gas pressure. The feed gas may comprise any of air, O2, N2, Ar, NH3, He and/or other appropriate processing gases. Plasma source 114 may include a gas expansion volume of a gas injector (e.g., without plasma) which provides a uniform gas flow through plasma generating panel 120. The uniform gas flow across the surface of the control plate may result in a common gas composition flowing through each of the gas feed lines associated with the discharge cells 110.

As shown in FIG. 1, the plasma source 114 may include an radio frequency (RF) (e.g., more than 250 kHz) or low frequency (LF) (e.g., less than 200 kHz) generator 108 that is designed to activate (e.g., deliver power) to the discharge cells 110. The plasma source 114 may include a controlled switch 104, which connects the discharge cells to a matcher 106 only when closed, and disconnects the discharge cells 110 from the matcher when open. Applying the RF voltage to a collection (e.g., a zone) of discharge cells 110 that are in closed loop with the matcher 106 resulting in that collection of discharge cells 110 emitting plasma related fluxes. In some embodiments, the generator 108 (e.g., using RF) may be designed to increase or reduce a power (e.g., via signals received by matcher 106) to maintain a predetermined voltage independent of the number of zone of discharge cells configured in a closed loop with the matcher (e.g., in an ON state). For example, in low frequency (LR) mode match may be unnecessary and switching between an ON and OFF state may result in less crosstalk than when using RF.

In some embodiments, the discharge cells 110 cannot be turned ON or OFF instantaneously (e.g., due to a matching between RF generator and the source). For example, if each cell were to turn on and off individually there would be (thousands and thousands of instanced RF on individual circuit loops that the matcher 106 may be incapable of performing. The range of matcher 106 may not be sufficient for all possible loads (e.g., independent discharge cell voltage matching). The discharge cells may be combined into one or more zones 130A-C. For example, as shown in FIG. 1 the panel 120 may include discharge cells from a central zone 130A, a middle zone 130B, and an edge zone 130C. The use of zones can limit the closed/open loop switching of the switch 104 and as a result can reduce the load requirements of the matcher 106 to match instantaneous load switching between individual discharge cells 110. The small number of zones may further not require addressing of individual discharge cells 110.

In some embodiments, the RF power level can be synchronized with the number of sources in the ON state, or be maintained at a fixed level. In the former cases, the fluxes from each operating sources can stay fixed independently of the number of zones operating ON, similar to a system with individually addressed discharge cells 110. The time correction may be performed iteratively and refined on an individual discharge cell 110 basis. For example, methods 700-800 of FIGS. 7-8 describe exemplary methodology to process a substrate and determine modifications to process recipes (e.g., exposure durations).

In the latter cases, fluxes in the zones turned ON depend on the number of such zones (turned ON) resulting in a non-binary process. To create a process recipe, process rates for each zone configuration are measured. This information can be uploaded to memory (stored locally on matcher 106, RF generator 108, or on a separate processing device). In some embodiments, the process recipe may be stored as a process rate matrix, and the plasma processing system 100 can create a time recipe $$\left(\frac{t_1}{t}\frac{t_2}{t}\frac{t_3}{t}, \ldots\right)$$

to create a uniform wafer result, following a substrate processing algorithm (e.g., using method 600 and/or 700). It should be noted that multiple recipes and/or process algorithms may be used to attain a process result within a target threshold window.

Figure 2:
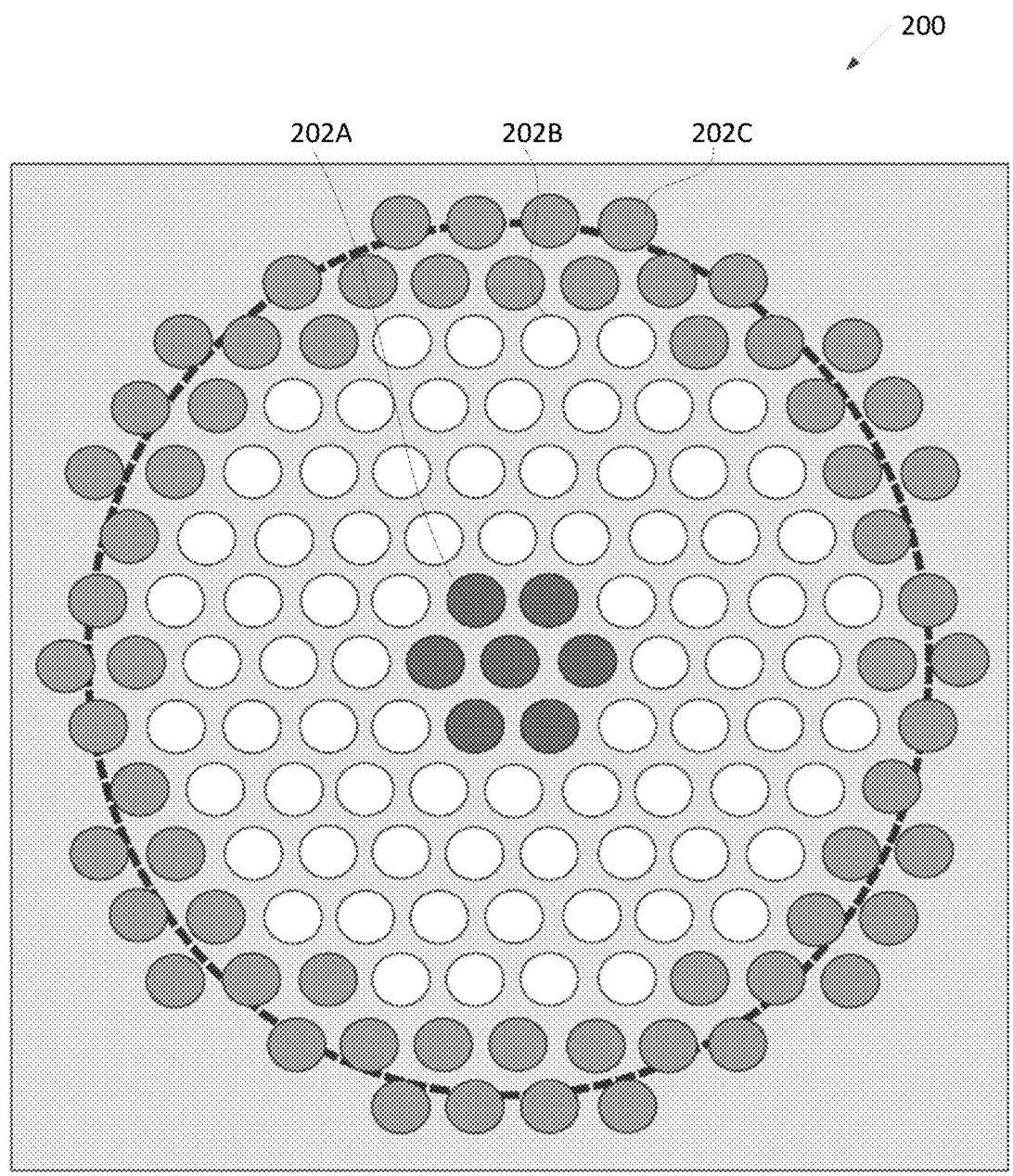
FIG. 2 illustrates an arrangement of plasma elements with time dependent zone control, according to aspects of the disclosure.

FIG. 2 illustrates an arrangement of plasma elements 200 with time dependent zone control, according to aspects of the disclosure. The arrangement of plasma elements 200 may be used in association with or as part of plasma processing system 100 of FIG. 1. For example, the control may be applied to local plasma generation above a substrate. In another example, the arrangement of plasma elements 200 may be used in combination with a common plasma source (e.g., ICP) where the control of the plasma elements 202A-C is used to control the local fluence (integral of flux over time) of high energy ions to a substrate.

As shown in FIG. 2, the plasma elements 202A-C may be associated (e.g., connected) into a few zones described in association with FIG. 1. For example, plasma elements 202A may be associated with a first zone (e.g., a center zone), plasma elements 202B may be associated with a second zone (e.g., a middle zone), and plasma elements 202C may be associated with a third zone (e.g., an edge zone). The time that an RF voltage (e.g., RF bias voltage) is applied to each zone can be controlled. It should be noted that the applied voltage to each zone can be independent of the number of active (e.g., ON state) plasma elements. In some embodiments, to achieve independent applied voltage, an RF generator may operate in a fixed output voltage mode. If a generator operates in the power control mode, the RF generator can supply a signal from the matching circuitry (e.g., matcher 106 of FIG. 1) to adjust power according to the number of active plasma elements 202A-C.

The time required for driving each of the multiple zones of plasma elements may be stored as a process recipe. For example, for the case shown in FIG. 2 with only 3 zones, the process recipe may include (t(a), t(b), t(c)) representing the exposure duration for each zone. The following is an exemplary method realizing the exposure file for a system with three zones, as previously introduced. Suppose t(a)<t(b)<t(c). The whole panel (all 3 zones) operates for the duration t(a), then zone A is turned OFF and only zones B and C operate for duration of t(b)−t(a), then zone B is turn OFF and only zone C operates for the remaining time t(c)−t(b). Three zones process control allows to achieve a process profile with substantially radial uniformity. The three sections of plasma elements 202A, 202B, 202C or zones allow for mitigating center-low, center-high, or M-shape and W-shape radial profiles on the substrate. In some embodiments, every element can operate the same way (e.g. same emission rate of plasma related fluxes), but for appropriate time (e.g. exposure duration of the plasma related fluxes) according to the plasma element's associated zone.

In some embodiments, while active (ON) zones of plasma elements are connected to an RF source, the inactive (OFF) zones of plasma elements may be grounded or float (i.e. not connected to anything). In some embodiments, the plasma related fluxes to the wafer of all species (e.g., ion, electrons, radicals, etc.) are independent on the state of the discharge cells, except high energy ions. In some embodiments, the high energy ions may only be present above the electrodes associated with an active (ON) zone.

Alternatively, the plasma elements 202A-C may represent many plasma shutters. A plasma source that generates a plasma that emits plasma related fluxes may be disposed proximate the plasma shutters. Each plasma shutter can be designed to switch between an open position and a closed position. While in the open position a plasma shutter may permit the ion and electron fluxes of the plasma to pass through the control plate and while in the closed position the plasma shutters block the plasma related fluxes from passing through the control plate. For example, the plasma shutter may be associated with a zone and controlled to selectively open and close to selectively expose a substrate to the plasma related fluxes flowing through the associated zone of plasma shutters.

Figure 3:
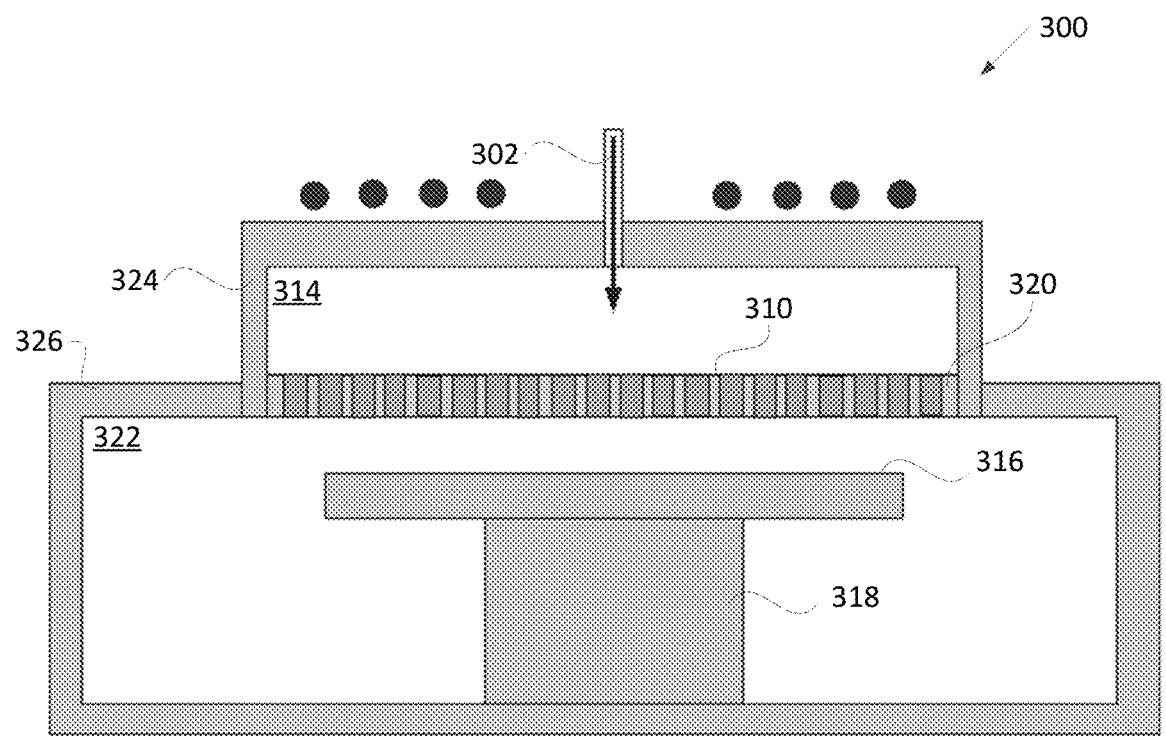
FIG. 3 illustrates a plasma processing system, according to aspects of the disclosure.

FIG. 3 illustrates a plasma processing system 300, according to aspects of the disclosure. The plasma processing system 300 may include a processing chamber 322 and a plasma source 314. The plasma source may include a gas intake 302 for directing a feed gas. The processing chamber 322 may include a substrate support structure 318 and a substrate 316. The plasma processing system 300 may include a control panel 320 (e.g., a two-dimensional (2D) controlling plate) that includes elements 310 capable of opening and closing. In some embodiments, the elements 310 may be independently opened and/or closed, however, in other embodiments the elements 310 may be associated with a collection of elements 310 or a zone of elements. The zone of elements may be actuated (e.g., open and/or closed) using power signals similar to those described in relation to FIG. 1. In some embodiments, controlling devices may control the zones of elements 310 and selectively actuate different zones of the control panel 320. For example, a plasma process recipe includes time duration of plasma exposure may be processed by the control panel 320 by selectively opening zones of elements 310 for time duration associated with the exposure duration of the plasma processing recipe.

In some embodiments, the plasma shutters include multiple electrode layers that perform the opening and closing that permits or blocks ions and electrons from flowing through the plasma shutters (e.g. through a control plate). The plasma shutters may include a first layer of electrodes (e.g. grid facing the plasma) disposed proximate and/or on a side of the plasma source. The first layer of the electrode may be maintained at floating potential. The plasma shutters may include a second layer of electrodes that includes a first ring of electrodes that are maintained at a floating potential when an associated plasma shutter is open and are maintained at a negative potential (reflects electrons) when the associated one of the plurality of plasma shutters is closed. The shutters may include a third layer of electrodes that includes ring electrodes to be maintained at the floating potential when an associated plasma shutter is open and maintained at a positive potential (reflects ions) when the associated plasma shutter is closed.

In some embodiments, neutral species flow freely through the plasma shutters, so closing the shutter only reduces the process rate instead of cutting off the process rate completely. Control of the shutters in every zone may be provided by connecting or disconnecting shutter electrodes to a set of voltages (e.g., direct current (DC), alternating current (AC)), using controlled switches.

Figure 4A:
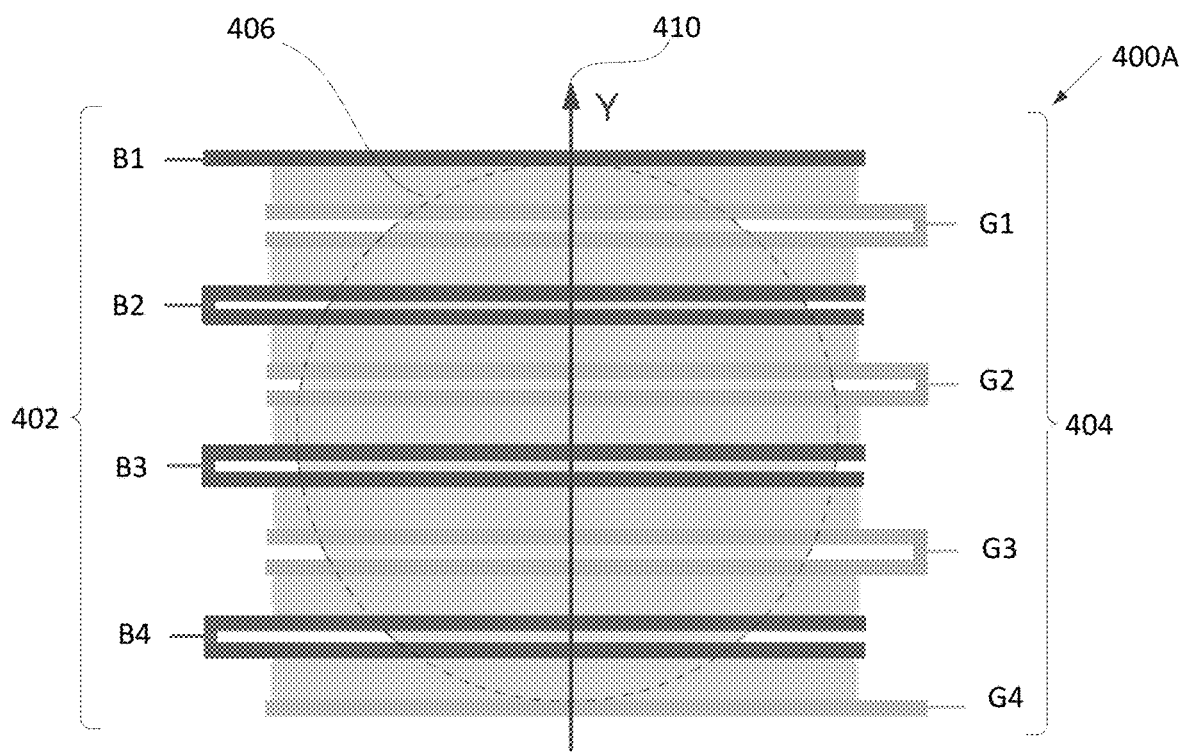
FIGS. 4A-C illustrate plasma delivery device using linear electrodes, according to aspects of the disclosure.
Figure 4B:
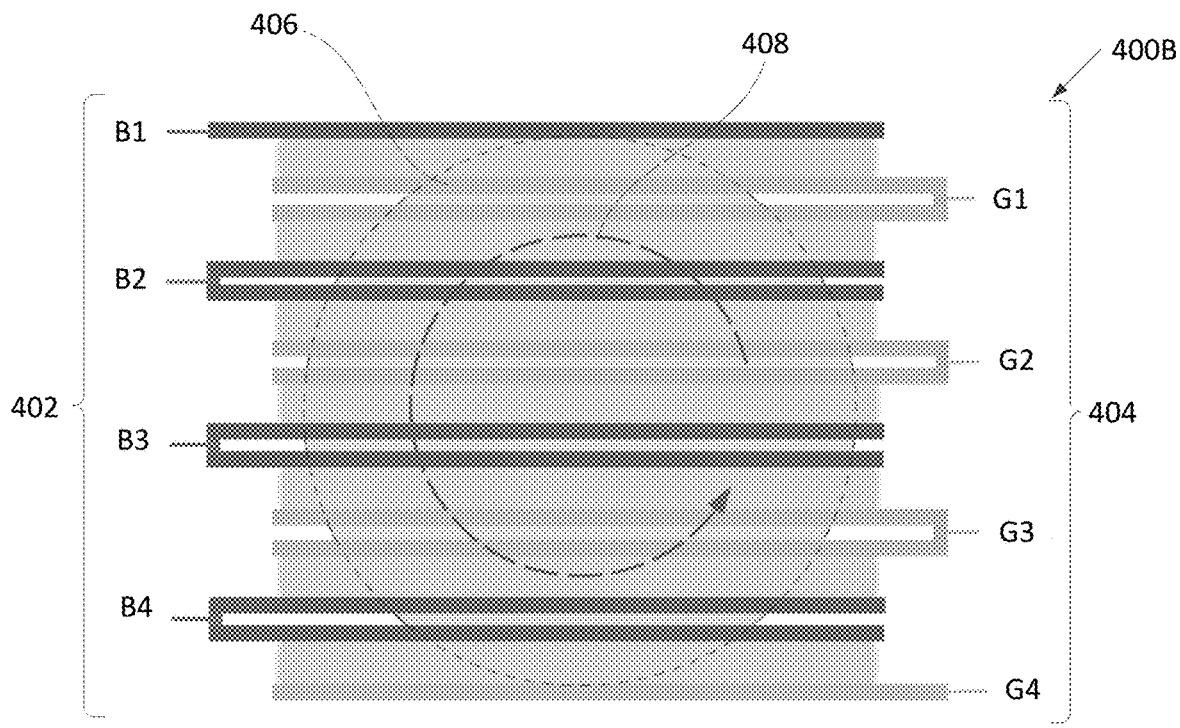
Figure 4C:
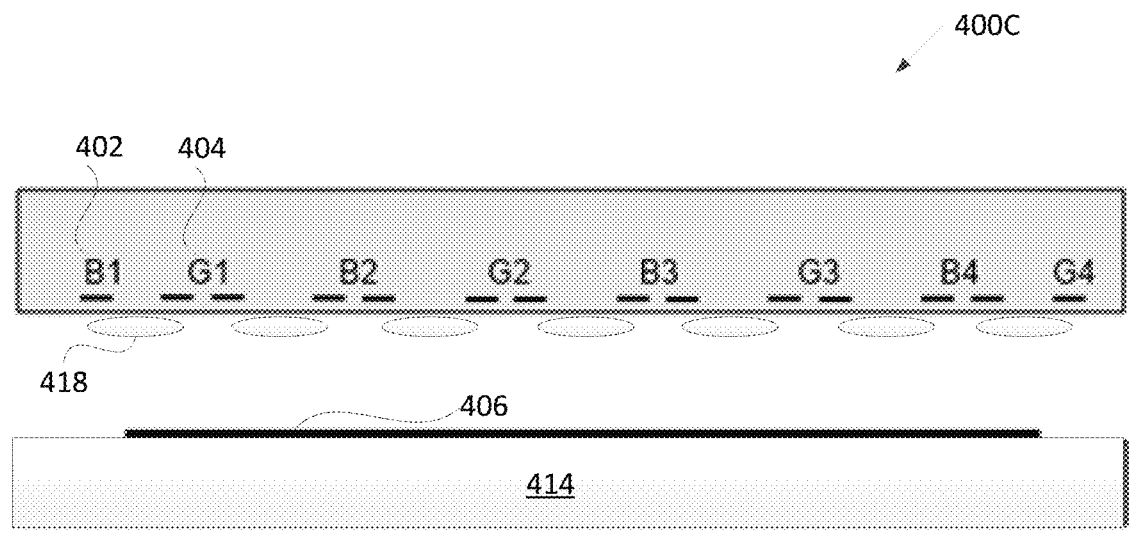

FIGS. 4A-C illustrate plasma delivery devices 400A-C using linear electrodes, according to aspects of the disclosure. The plasma delivery devices 400A-C may be used in association with plasma delivery systems 100, 300, or another plasma delivery device not described herein. The plasma delivery device may include electrodes B1-B4, G1-G4, arranged such that a discharge occurs between electrodes (e.g., only between the electrodes connected to opposite terminals B and G plasma generation zones 418). The electrodes may be displaced above a substrate 406 (shown behind the electrodes in FIGS. 4A-B and below the electrodes in FIG. 4C upon pedestal 414), buried inside a dielectric surface, separating them from plasma (e.g., as shown in FIG. 4C). The electrodes may be connected to different terminals 402, 404 of a power supply (e.g., alternating current (AC) or radio frequency (RF)). A first set of electrodes B1-B4 are connected to a first terminal 402 (e.g., a "B" terminal), and a second set of electrodes G1-G4 are connected to a second terminal 404 (e.g., a "G" terminal). Discharge can be initiated between the B and G electrodes. For example, discharge may occur between (B1, G1), (B2, G2), (B3, G3), and/or (B4, G4). Connecting and disconnecting electrodes from the power supply can initiate discharge between any pairs of electrodes. The discharge may initiated to align with an axis 410 (e.g., a parallel axis to a surface of the substrate). The controlled discharge of the electrodes can control an exposure of a substrate 406 to plasma (uniformity control) along this axis 410. The electrodes may be controlled by varying discharge time for any pair of electrodes.

In some embodiments, linear uniformity control along an axis 410 is converted to radial control using wafer rotation. As shown in FIG. 4B, a substrate 406 may be rotated along rotation path 408 relative to the linear electrodes. The electrodes crossing the center (Y=0) of the substrate 406 may produce maximum exposure in the center, and electrodes touching the edge (Y≅±$R_{max}$), may produce maximum exposure at an edge. Pairs of electrodes disposed in between generate a maximum plasma exposure in between the edge and the center of the substrate 406. The plasma delivery device 400B can control discharge time for every pair of electrodes and can compensate for radial non-uniformities originated from running discharge between all pairs for equal time.

Figure 5:
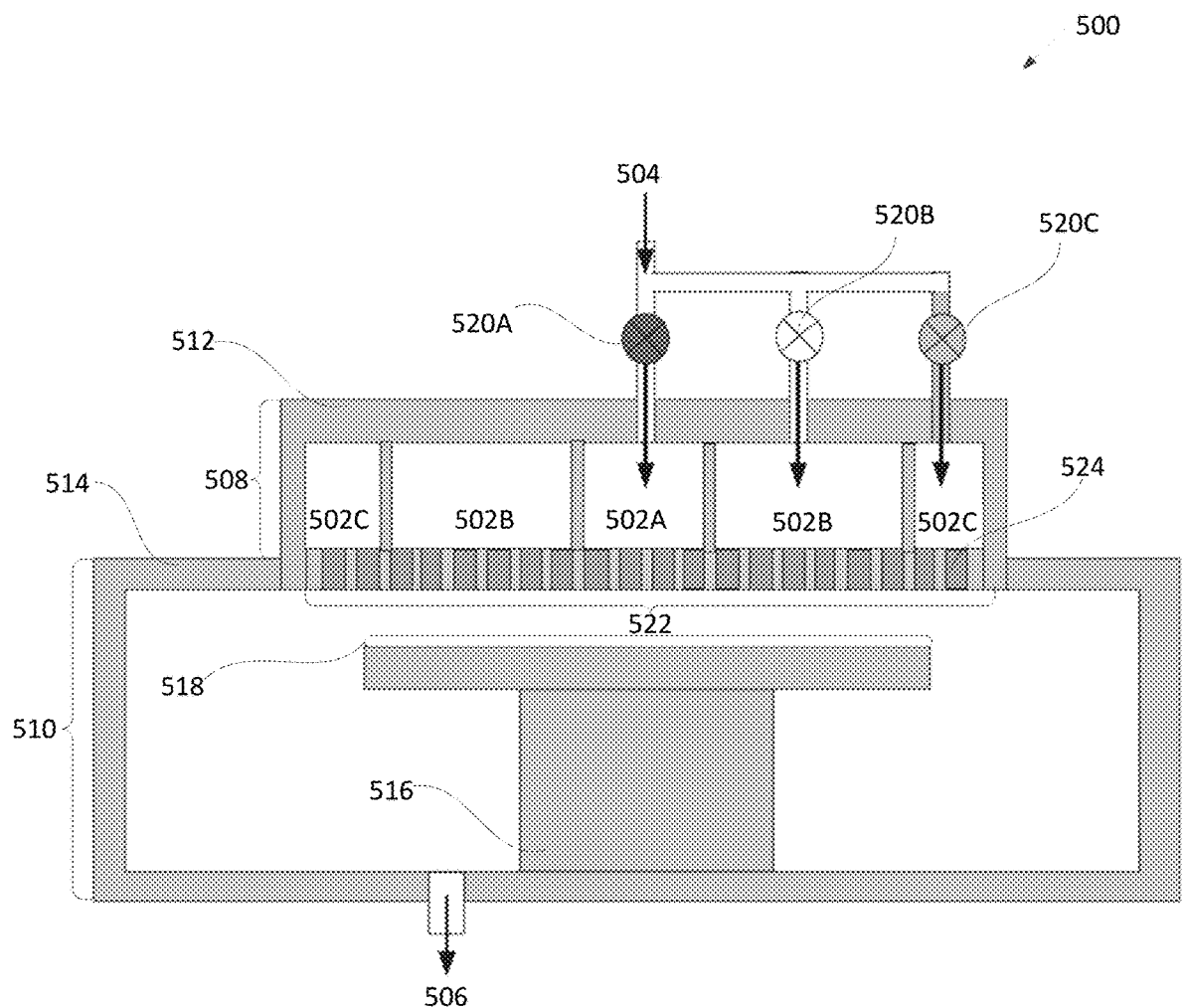
FIG. 5 illustrates a plasma processing system using multiple gas injection zones, according to aspects of the disclosure.

FIG. 5 illustrates a plasma processing system 500 using multiple gas injection zones 502A-C, according to aspects of the disclosure. The plasma processing system 500 may include a plasma source 508 and a plasma processing chamber 510. The plasma source may include a gas intake 504 for directing a feed gas. The plasma may include multiple gas injection sites with associated switches 520A-C. The multiple gas injection site may be associated with one or more operational zones 502A-C. The plasma processing system 500 may include a control panel 522 with one or more plasma elements 524. The plasma elements may include RF plasma sources operating at a fixed power. The plasma source may include walls 512 to maintain a pressure within the plasma source, and individual walls dividing the one or more gas injection sites associated with the one or more operational zones 502A-C. In some embodiments, as shown in FIG. 5, the gas injection is split into three substantially circular zones 502A-C, controlling gas flow through plasma elements 524 on the control panel 522. In other embodiments, various geometric configurations may be used instead of or in addition to the substantially circular zones 502A-C.

Controlling a process rate of the plasma processing system 500 may include switching ON or OFF gas flow through each operational zone 502A-C (e.g., compared to switching RF power as discussed in other embodiments). Turning the gas flow (e.g., closing the valve switch 520A-C) may not necessarily reduce a process rate to zero (e.g., plasma element may still generate plasma and diffusive components to ion and radical fluxes may still reach the substrate). In some embodiments, binary control may not be realized as ON/OFF but simply ON1/ON2 with two levels of process control based on the activation of operation zones 502A-C resulting from gas flow through valve switches 520A-C. In some embodiments, the total flow can be synchronized with switching zones 502A-C OFF and the rates (ON2) will drop to a reduced value in associated with the pressure of the plasma processing system 500. In some embodiments, the pressure and gas flow through valve switches 520A-C may be synchronized to have a binary system, where the OFF zones provide a negligible process rate (e.g., zero process rate).

As noted previously, in some embodiments, recipes can be used based on the relationship of the controlling devices (e.g., valve switches 520A-C) and controlled devices (e.g., process rate resulting from activating associated plasma elements 524). Using ON and OFF rates a recipe associated with a process result can create $$\left(\frac{t_1}{t}, \frac{t_2}{t}, \frac{t_3}{t}, \ldots\right)$$

associated with the gas flow through the multiple operational zones 502A-C. For example, the plasma process system 500 may include 3 zones and the rates when all gas lines are open can be related in the following manner: $r_{10} > r_{20} > r_{30}$, where the zones are numbered in the order of descending process rate. When the gas flow through any of these zones is OFF, the rates are $r_{11}, r_{21}, r_{31}$, respectively. To achieve uniformity the process time would need to reverse the order of process rate (e.g., zones having a faster process rate should have shorter activation duration compared to activation durations of zones having slower process rates). For example, the activation durations would be as follows: $t_1 < t_2 < t_3$. In this example, the relationship between activation times, process rates, and process results in each zone can be expressed as the following linear equations:

$$r_{10}t_1 + r_{11}(t_3 - t_1) = h_1 = h \quad \text{Equation 1}$$

$$r_{20}t_2 + r_{21}(t_3 - t_2) = h_2 = h \quad \text{Equation 2}$$

$$r_{30}t_3 = h_3 = h \quad \text{Equation 3}$$

Equation 1, Equation 2, Equation 3 can be expressed in the following matrix form $$\begin{pmatrix} r_{10} - r_{11} & 0 & r_{11} \\ 0 & r_{20} - r_{21} & r_{21} \\ 0 & 0 & r_{30} \end{pmatrix} \begin{pmatrix} t_1 \\ t_2 \\ t_3 \end{pmatrix} = \begin{pmatrix} h_1 \\ h_2 \\ h_3 \end{pmatrix} \quad \text{Equation 4}$$

Or alternatively expressed as $$R \cdot T = H \quad \text{Equation 5}$$

Where R is a matrix, and T and H are vectors as shown above. Solving this equation can yield the process recipe. Conventional matrix equation solving methods can leverages to identify the process recipe vector:

$$T = R^{-1} \cdot H \quad \text{Equation 6}$$

For example, the inverse of the relationship matrix R can be determine and operated with the process result to identify a process recipe that yields a uniform process result within a threshold tolerance.

In some embodiments, the ON/OFF control is not an optimum when a process is sensitive to smaller changes activating and deactivating the operational zones 502A-C (e.g., ON/OFF is not instantaneous or the switch of an operational zone influences the process rate of switching operation zones affect the process rate of another static is dynamic operational zone).

In some embodiments, a plasma processing system may include a lamp heating wafer (e.g., in place of substrate 518) that uses multiple lamps (e.g., in place of plasma elements 524) combined into several zones (e.g., analogous to operational zones 502A-C). Temperature of each zone (e.g., similar to gas flow in FIG. 5) is monitored and the appropriate power is applied to it. The temperature uniformity inside each zone may be provided by consistent output performance of each of the lamps. In this embodiment, the cost of lamp control may be minimized, however the cost of replacement and associated remedial action may be high.

In some embodiments, temperature uniformity inside each zone or across a substrate may include a multiple lamp power levels and digital control of a duty cycle for each lamp (e.g., using addressing). Calibration can be made using infrared (IR) image of the substrate temperature and using, for example, 2 power levels (or 2 voltage levels differed by a threshold percentage (e.g., 10-20%)) and determine the duty cycle for each lamp for any of these levels to provide uniformity of the substrate temperature within a zone. Switching between 2 levels rather than max and zero may prolong a life of a lamp. Switching between 2 levels may also reduce the precision requirements to lamp manufacturing (e.g., also reducing the initial lamp cost and the cost of operation. For example, a calibration procedure may be periodically run in place of regularly replacing lamps.

FIGS. 6-10 depict flow diagrams illustrating example methods 600-1000 related to uniformity control for plasma processing, in accordance with some implementations of the disclosure. For simplicity of explanation, methods 600-1000 are depicted and described as a series of acts. However, acts in accordance with this disclosure can occur in various orders and/or concurrently and with other acts not presented and described herein. Furthermore, not all illustrated acts may be performed to implement methods 600-1000, in accordance with disclosure subject matter. In addition, those skilled in the art will understand and appreciate that methods 600-1000 could alternatively be represented as a series of interrelated states via a state diagram or events. Methods 600-1000 may be performed, for example, by plasma processing systems and devices 100-500 as described in associated with FIGS. 1-5. At least some operations of methods 600-1000 are controlled and/or implemented by a controller of a process chamber.

Figure 6:
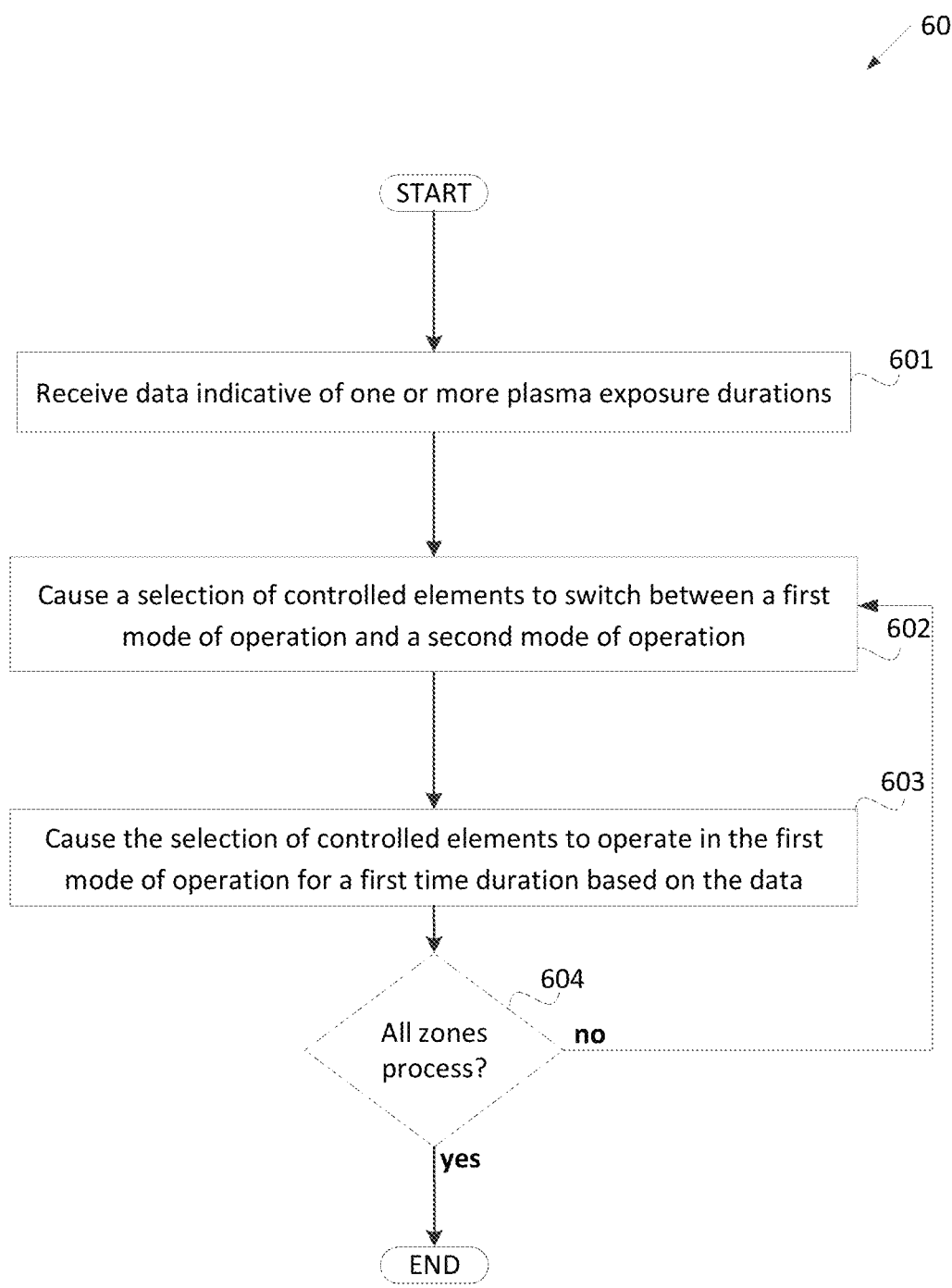
FIG. 6 is a flow chart of a method for substrate processing, according to aspects of the disclosure.

FIG. 6 is a flow chart of a method 600 for substrate processing, according to aspects of the disclosure. Referring to FIG. 6, at block 601 processing logic receives data indicative of one or more plasma exposure durations. The data may include one or more plasma exposure duration associated with a selection of controlled elements (e.g., plasma sources, plasma shutters, bias electrodes, heat sources, etc.). For example, a process recipes (e.g., a matrix of exposure duration associated with a set or zone of controlled elements) with controlling instructions for a process controller (e.g., power supply, RF or alternating current (AC) generator to control one or more controlled elements (e.g., plasma sources, plasma shutters, bias electrodes, heat sources, and the like). The data may be stored within a plasma process system (e.g., plasma processing system 100 of FIG. 1), alternatively or additionally, the data may be received from a source external to the plasma processing system (e.g., a remote storage medium such as a universal serial bus (USB)).

At block 602, processing logic causes a selection of controlled elements to switch between a first mode of operation and a second mode of operation. The first mode of operation may be associated with a first level of plasma processing control and the second mode of operation may be associated with a second level of plasma processing control. For example, the selection of controlled elements may process a substrate at an increased rate while operating in the first mode of operation relative to the second mode of operation (e.g., one or more locations across a surface of the substrate may be processed quicker while the controlled elements are operating in the first mode of operation relative to the second mode of operation).

In some embodiments, the processing logic may be performed by a processing device coupled to a power supply. The controlled elements may include one or more plasma sources designed to receive power from the power supply and generate the plasma related fluxes. In some embodiments, the processing device is coupled to matching circuitry. The matching circuitry may maintain a first voltage level across the one or more plasma sources when the selection (e.g., plurality) of controlled elements operates in the first mode of operation. The matching circuitry may maintain a second voltage level across the one or more plasma sources when the selection of controlled elements operates in the second mode of operation. In some embodiments the second voltage level is greater than the first voltage level, and in other embodiments the second voltage level is less than the first voltage level.

In some embodiments, switching between the first mode of operation and the second mode of operation may include connecting and/or disconnecting an associated selection of controlled elements from a power supply. In some embodiments, as mentioned previously, switching between the first mode of operation and the second mode of operation include increasing/decreasing a power level (e.g., voltage level) delivered to the selection of controlled elements. In some embodiments, switching between the first mode and the second include opening/closing one or more gas injection valves associated with a plasma processing system.

At block 603, processing logic causes the selection of controlled elements to operate in the second mode of operation for a first time duration based on the data. As noted previously, the selection of controlled elements may be associated with an operating zone of a plasma processing system (e.g., plasma processing system 100 of FIG. 1).

At block 604, processing logic determines whether all operating zones have been processed. Responsive to determining that all the operating zones have been processed, processing logic proceeds along the yes path and ends. Responsive to determining that all zones have not been processed, processing logic proceeds along the no path to block 602 and proceeds with one or more of the remaining zones of processing elements. In some embodiments, the process continues until an end condition of the plasma process is met (e.g., a process result meets a threshold condition).

In some embodiments, the plasma processing system may include a control panel (e.g., control panel 120 of FIG. 1) with a first selection of controlled elements disposed within a first area of the control panel and a second selection of controlled elements are disposed within a second area of the control panel. The first area may be surrounded by the second area. For example, the various zones associated with the controlled elements may provide radial control associated with processing a substrate.

In some embodiments, the one or more zone are processed iteratively. For example, a first zoned may be processes, followed by a second zone, followed by a third zone, and so forth. In some embodiments, the one or more zones are processed at least partially simultaneous one to another. For example, a first selection of controlled elements may operate in a first mode of operation (e.g., at an increased processing rate, high power mode, high gas flow rate mode, etc.) at least partially simultaneous to a second selection of controlled elements operating in the first mode of operation.

In some embodiments, a power supply may maintain a substantially consistent power level when the controlled elements are operating in the first mode and the second mode. For example, mechanical switches, such as gas injection valves may be used to open and/or close to alter a gas flow rate that will switch the controlled elements between a first and second modes of operation while a power supply maintains a consistent voltage across the controlled elements during switches between modes of operation.

In some embodiments one or more selections of controlled element may include one or more sets of linear electrodes. For example, a first set of linear electrodes may be coupled (e.g., connected, electrically able to communicate one with another) a first terminal of a power supply and a second set of linear electrodes may be coupled to a second terminal of the power supply. In some embodiments, processing logic may further cause the first set of linear electrodes and the second set of linear electrodes to discharge the plasma related fluxes. The one or more linear electrodes may process the substrate along a first axis parallel to a surface of the substrate.

In some embodiments, the plasma processing system may include a rotational plate to support a substrate during plasma processing. The rotational plate may rotate the substrate about an axis perpendicular to a surface of the substrate. For example, using linear electrodes and a rotation plate a plasma processing system may be capable of processing a substrate around a 360 Degree range of motion by rotating an active processing axis about an axis perpendicular to a surface of the substrate. For example, processing logic may cause rotation of the substrate about a second axis perpendicular to the surface of the substrate.

Figure 7:
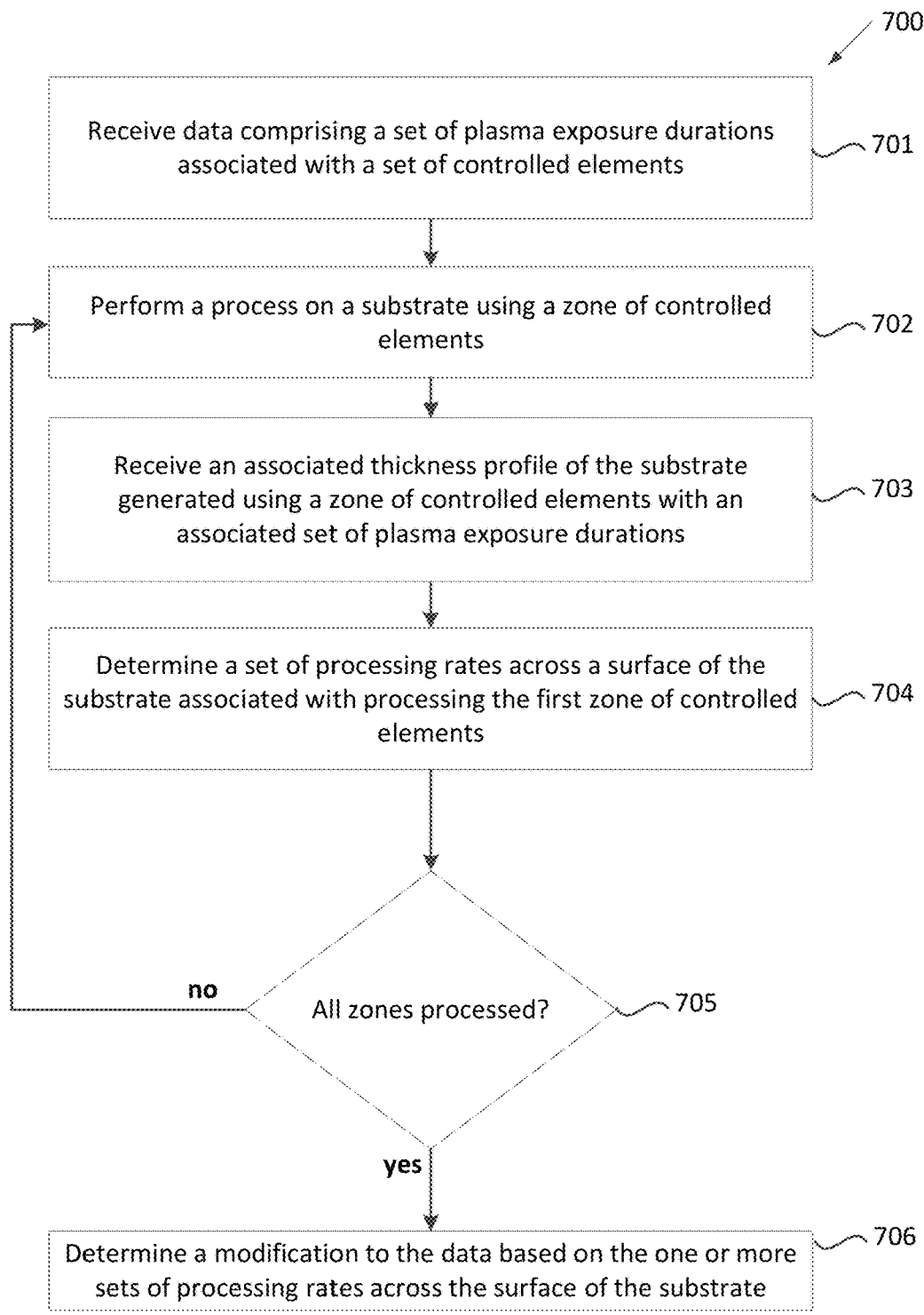
FIG. 7 is a flow chart of a method for tuning a plasma process, according to aspects of the disclosure.

FIG. 7 is a flow chart of a method 700 for tuning a plasma process, according to aspects of the disclosure. 700 may include, generally, processing one or more wafers (e.g., two wafers at a time) using a variety of exposure duration across multiple zones of controlled elements and drawing a comparison between the resulting process results (e.g., associated thickness profiles) and determine process rates associated with the various zones of controlled elements. A modification to the processing instructions (e.g. changes to one or more exposure duration) can be determined based on the one or more determine process rates across a surface of the substrates. For example, modifying one of the first data may be responsive to determining that the rate of thickness value change of one or more processing locations meets a threshold value.

Referring to FIG. 7, at block 701 processing logic receives data comprising a set of plasma exposure durations associated with a set of controlled elements. The data may include a process recipe in the form of a vector. For example, each element of the recipe (e.g., time exposure vector) may be associated with a time duration for a given zone of controlled elements to process the substrate. In some embodiments, the initial recipe may include uniform values (e.g., each zone of controlled elements may be activated (e.g., operate in a high process rate mode or "first operating mode") that will be tuned through process steps of method 700.

In some embodiments (e.g., non-binary process operational modes) controlling elements may not be capable of independent control of individual plasma sources and/or zones of plasma sources. For example, in the case with switching gas injection zones ON and OFF (e.g., embodiments described in association with FIG. 5), gas may flow through each plasma source depending on the combination of operation zones that are activated. Using a exemplary three operational zone system, if all zones are ON, gas flows through them at a first rate. If the second operational zone and/or the third operational zones are deactivated (e.g., OFF) then flow to the first operational zone will shift with the flow to the second and third sources be closed (e.g., by valves). In a some embodiments (e.g., binary control) the total flow may be adjusted to maintain independent control of individual plasma sources and/or operation zones, while in other embodiments (e.g., non-binary control), total flow is not adjusted dependent on a combination of activated controlled elements and/or operational zones and as such the substrate may be processed at different rates dependent on the combination of controlled elements and/or operational zones active at any given moment during a plasma process.

At block 702, processing logic performs a process on a substrate using a zone of controlled elements. Performing a process on a substrate may include causing a zone of controlled elements to operate in a high process rate mode for an associated exposure duration. For example, processing the substrate may include one or more steps and/or process associated with one or more blocks of method 600 of FIG. 6.

At block 703, processing logic receives an associated thickness profile of the substrate generated using a zone of controlled elements with an associated set of plasma exposure durations. The thickness profile may be associated with processing an individual zone of controlled elements or a combination of one or more zones of controlled elements. For example, one or more zones may be process for an associated plasma exposure duration ($t_1$, $t_2$, $t_3$, . . . ) and the thickness profile may include the resulting process thickness values ($h_1$, $h_2$, $h_3$, . . . ).

At block 704, determines a set of processing rates across a surface of the substrate associated with processing the first zone of controlled elements. In some embodiments, the processing rates are determined by solving a matrix equation or compound matrix equation (e.g., Equation 5 as previously described). In some embodiments the process rates are linear while in other embodiments, the process rates are not linear and potentially may require complex algorithmic methodology that determines (e.g., using matrix solvers such as decomposition, interactive matrix solvers, and/or machine learning models) as will be discussed further in later embodiments.

At block 705, processing logic determines whether all operating zones have been processed. Responsive to determining that all the operating zones have been processed, processing logic proceeds along the yes path to block 706. Responsive to determining that all zones have not been processed, proceeds along the no path to block 702 and proceeds with one or more of the remaining zones of processing elements. In some embodiments this process continues until an end condition of the plasma process is met (e.g., a process result meets a threshold condition).

In some embodiments, the one or more zone are processed iteratively. For example, a first may be process, followed by a second zone, followed by a third zone, and so forth. In some embodiments, the one or more zones are process at least partially simultaneous one to another. For example, a first selection of controlled elements may operate in a first mode of operation (e.g., at an increased processing rate, high power mode, high gas flow rate mode, etc.) at least partially simultaneous to a second selection of controlled elements operating in the first mode of operation.

At block 706, processing logic determines a modification to the data based on the one or more sets of processing rates across the surface of the substrate. Method 700 may be repeated to obtain multiple modifications to the data. The aggregate of modifications may be applied to the data to generated updated plasma exposure data that when processed generate a process result that meets a threshold condition (e.g., meets a target process uniformity).

Figure 8:
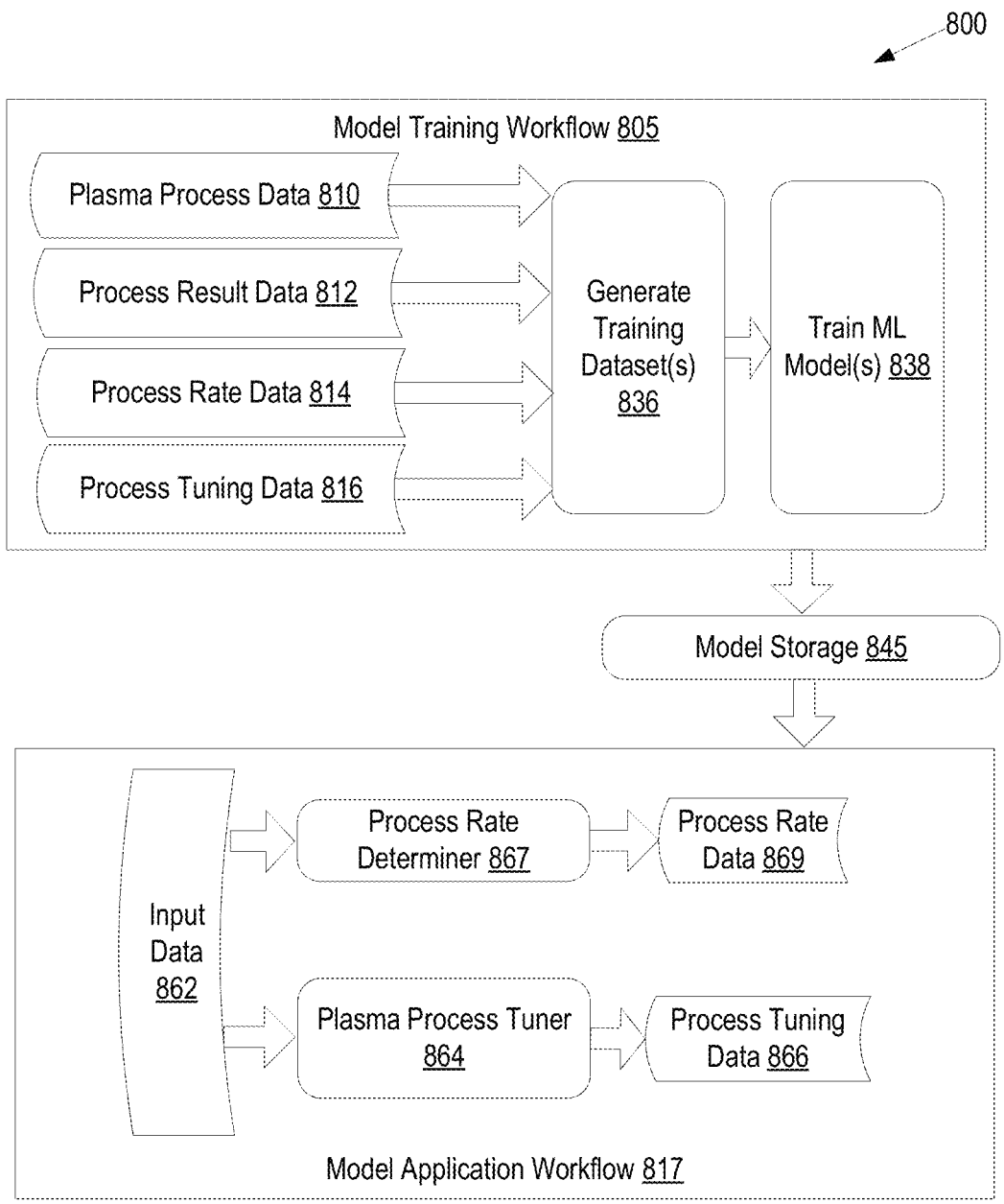
FIG. 8 illustrates a model training workflow and a model application workflow for a plasma uniformity process rate determination and plasma uniformity tuning according to aspects of the disclosure.

FIG. 8 illustrates a model training workflow 805 and a model application workflow 817 for a plasma uniformity process rate determination and plasma uniformity tuning, according to aspects of the disclosure. In embodiments, the model training workflow 805 may be performed at a server which may or may not include a process rate determination and/or plasma uniformity tuning application, and the trained models are provided to a uniformity processing and/or tuning application, which may perform the model application workflow 817. The model training workflow 805 and the model application workflow 817 may be performed by processing logic executed by a processor of a computing device. One or more of these workflows 805, 817 may be implemented, for example, by one or more machine learning modules implemented processing device and/or other software and/or firmware executing on a processing device.

The model training workflow 805 is to train one or more machine learning models (e.g., deep learning models) to perform one or more determining, predicting, modifying, etc. tasks associated with a process rate determination and/or plasma process tuning (e.g., tuning a process recipe to process a result to meet target process result threshold conditions). The model application workflow 817 is to apply the one or more trained machine learning models to perform the determining and/or tuning, etc. tasks for plasma process data (e.g., one or more plasma exposure durations, one or more controlled element zone associations). One or more of the machine learning models may receive process result data (e.g., one or more thickness profiles processed with the plasma process data).

Various machine learning outputs are described herein. Particular numbers and arrangements of machine learning models are described and shown. However, it should be understood that the number and type of machine learning models that are used and the arrangement of such machine learning models can be modified to achieve the same or similar end results. Accordingly, the arrangements of machine learning models that are described and shown are merely examples and should not be construed as limiting.

In embodiments, one or more machine learning models are trained to perform one or more of the below tasks. Each task may be performed by a separate machine learning model. Alternatively, a single machine learning model may perform each of the tasks or a subset of the tasks. Additionally, or alternatively, different machine learning models may be trained to perform different combinations of the tasks. In an example, one or a few machine learning models may be trained, where the trained machine learning (ML) model is a single shared neural network that has multiple shared layers and multiple higher level distinct output layers, where each of the output layers outputs a different prediction, classification, identification, etc. The tasks that the one or more trained machine learning models may be trained to perform are as follows:

a. Process rate determination—As discussed previously, various zones of controlled elements may operate in multiple operating modes (e.g., high substrate process rate mode and low substrate process rate mode) for various exposure durations (e.g., according to a process recipe). The various zones of controlled elements operating in the various operating mode results in various substrate process rates across multiple locations of a substrate. The model would receive exposure duration and process result profiles (e.g., thickness profiles) and determine the process rates various controlled elements leverage at various locations across the substrate.

b. Plasma process tuning—As described previously plasma processes may include a process recipe that includes a set of plasma exposure durations associated with one or more selections of controlled elements designed to expose a substrate to plasma related fluxes. A machine learning model may receive a process recipe and resulting thickness profiles associated with process the substrate using one or more selections (e.g., zones) of controlled elements. The model may output data indicative of modifications to a plasma process recipe (e.g., one or more plasma exposure durations). For example the modifications when applied to a process recipe may result in processing a substrate whose process result profile meets a target threshold condition (e.g., a process uniformity threshold).

One type of machine learning model that may be used to perform some or all of the above tasks is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). Deep learning is a class of machine learning algorithms that use a cascade of multiple layers of nonlinear processing units for feature extraction and transformation. Each successive layer uses the output from the previous layer as input. Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. In a plasma process tuning, for example, the raw input may be process result profiles (e.g., thickness profiles indicative of one or more thickness values across a surface of a substrate); the second layer may compose feature data associated with a status of one or more zones of controlled elements of a plasma process system (e.g., orientation of zones, plasma exposure duration, etc.); the third layer may include a starting recipe (e.g., a recipe used as a starting point for determining an updated process recipe the process a substrate to generate a process result the meets threshold criteria). Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

In one embodiment, one or more machine learning model is a recurrent neural network (RNN). An RNN is a type of neural network that includes a memory to enable the neural network to capture temporal dependencies. An RNN is able to learn input-output mappings that depend on both a current input and past inputs. The RNN will address past and future flow rate measurements and make predictions based on this continuous metrology information. RNNs may be trained using a training dataset to generate a fixed number of outputs (e.g., to determine a set of substrate processing rates, determine modification to a substrate process recipe). One type of RNN that may be used is a long short term memory (LSTM) neural network.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and back-propagation to tune the weights of the network across all its layers and nodes such that the error is minimized. In many applications, repeating this process across the many labeled inputs in the training dataset yields a network that can produce correct output when presented with inputs that are different than the ones present in the training dataset.

For the model training workflow 805, a training dataset containing hundreds, thousands, tens of thousands, hundreds of thousands or more plasma process data 810 (e.g., plasma exposure duration associated with zones of controlled elements) and/or process result data (e.g., one or more thickness profiles associated with the plasma process data) 812 should be used to form a training dataset. In embodiments, the training dataset may also include an associated substrate process rate data 814 (e.g., process rates across of surface of the surface associated with the plasma process data 810 and the process result data 812) and process tuning data (e.g., modification to plasma process data responsive to processing a substrate to meet a threshold criterion such a process uniformity) for forming a training dataset, where each data point may include various labels or classifications of one or more types of useful information. Each case may include, for example, data indicative of a one or more plasma exposure duration, associated thickness profiles of an associated substrate processed in associated with the one or more plasma exposure durations, substrate process rate associated with the plasma process data 810 and process result data 812, and process tuning data 816. This data may be processed to generate one or multiple training datasets 836 for training of one or more machine learning models. The machine learning models may be trained, for example, to automate tuning of a plasma process recipe (e.g., determine modification to plasma exposure duration, update a recipe and process another substrate to obtain more data to obtain another modification until a substrate processed with the tuned process recipe attains a processing result that meets a threshold condition such a process uniformity.)

In one embodiment, generating one or more training datasets 836 includes gathering one or more plasma process data and process result data associated with the plasma process data. The labels that are used may depend on what a particular machine learning model will be trained to do. For example, to train a machine learning model to perform process rate determination, a training dataset 836 may include data labels indicative locations across the substrate associated with process result measurements and process rate determinations. For example, as described in other embodiments the process recipes and/or process results may be represented as vectors and the process rates may be represented as one or more matrices.

To effectuate training, processing logic inputs the training dataset(s) 836 into one or more untrained machine learning models. Prior to inputting a first input into a machine learning model, the machine learning model may be initialized. Processing logic trains the untrained machine learning model(s) based on the training dataset(s) to generate one or more trained machine learning models that perform various operations as set forth above.

Training may be performed by inputting one or more of the plasma process data 810, process result data 812, process rate data 814, and process tuning data 816 into the machine learning model one at a time.

The machine learning model processes the input to generate an output. An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer may be another hidden layer or an output layer. In either case, the nodes at the next layer receive the output values from the nodes at the previous layer, and each node applies weights to those values and then generates its own output value. This may be performed at each layer. A final layer is the output layer, where there is one node for each class, prediction and/or output that the machine learning model can produce.

Accordingly, the output may include one or more predictions or inferences. For example, an output prediction or inference may include one or more modifications to plasma process data (e.g., modifications to one or more plasma exposure durations). Processing logic may cause a substrate to be process using the updated recipe (e.g., with the identified modifications) and receive an updated thickness profile. Processing logic may compare the updated thickness profile against a target thickness profile and determine whether a threshold criterion is met (e.g., thickness values measured across a surface of the wafer fall within a target threshold value window). Processing logic determines an error (i.e., a classification error) based on the differences between the updated thickness profile and the target thickness profile. Processing logic adjusts weights of one or more nodes in the machine learning model based on the error. An error term or delta may be determined for each node in the artificial neural network. Based on this error, the artificial neural network adjusts one or more of its parameters for one or more of its nodes (the weights for one or more inputs of a node). Parameters may be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters may include adjusting the weights assigned to each of the inputs for one or more neurons at one or more layers in the artificial neural network.

Once the model parameters have been optimized, model validation may be performed to determine whether the model has improved and to determine a current accuracy of the deep learning model. After one or more rounds of training, processing logic may determine whether a stopping criterion has been met. A stopping criterion may be a target level of accuracy, a target number of processed images from the training dataset, a target amount of change to parameters over one or more previous data points, a combination thereof and/or other criteria. In one embodiment, the stopping criteria is met when at least a minimum number of data points have been processed and at least a threshold accuracy is achieved. The threshold accuracy may be, for example, 70%, 80% or 90% accuracy. In one embodiment, the stopping criterion is met if accuracy of the machine learning model has stopped improving. If the stopping criterion has not been met, further training is performed. If the stopping criterion has been met, training may be complete. Once the machine learning model is trained, a reserved portion of the training dataset may be used to test the model.

As an example, in one embodiment, a machine learning model (e.g., process rate determiner 867) is trained to determine substrate processing elements. A similar process may be performed to train machine learning models to perform other tasks such as those set forth above. A set of many (e.g., thousands to millions) process results profiles (e.g., thickness profiles) may be collected and process rate data 869 associated with predicted or inferred concentrations associated with the input data 862 may be determined.

Once one or more trained machine learning models 838 are generated, they may be stored in model storage 845, and may be added to a substrate process rate determination and/or process tuning application. Substrate process rate determination and/or process tuning application may then use the one or more trained ML models 838 as well as additional processing logic to implement an automatic mode, in which user manual input of information is minimized or even eliminated in some instances.

For model application workflow 817, according to one embodiment, input data 862 may be input into process rate determiner 867, which may include a trained neural network. Based on the input data 862, process rate determiner 867 outputs information indicative of a set of process rate values across a surface of a substrate (e.g., process rate data 869).

According to one embodiment, input data 862 may be input into plasma process tuner 864, which may include a trained neural network. Based on the input data 862, plasma process tuner 864 outputs modification to plasma exposure data and/or updated plasma exposure data (e.g., process tuning data 866).

Figure 9:
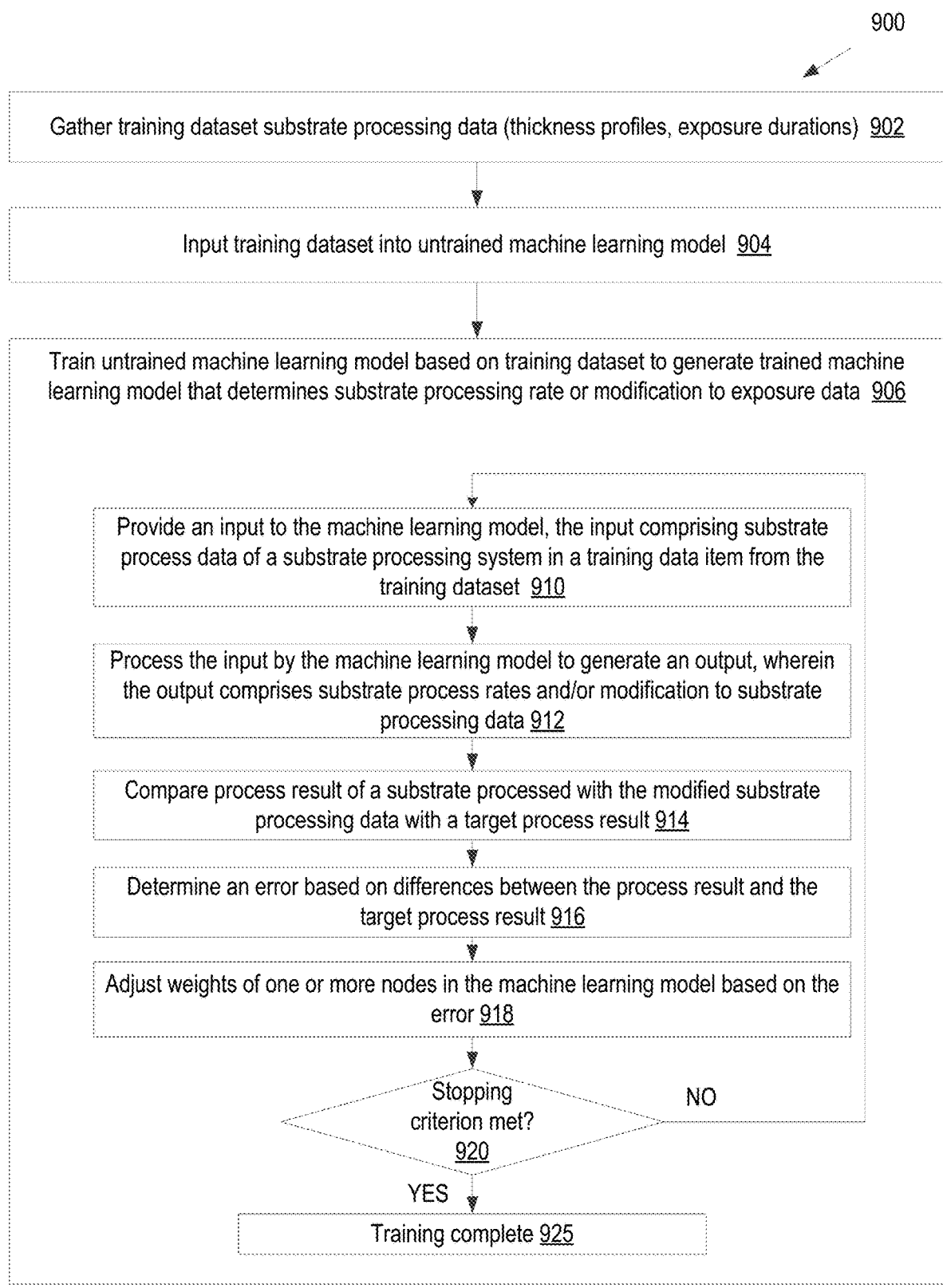
FIG. 9 is a flow chart illustrating an embodiment for a method of training a machine learning model to determine substrate processing rates and/or plasma process tuning modification of plasma processing data, in accordance with an embodiment of the present disclosure.

FIG. 9 is a flow chart illustrating an embodiment for a method 900 of training a machine learning model to determine substrate processing rates and/or plasma process tuning modification of plasma processing data, in accordance with an embodiment of the present disclosure. At block 902 of method 900, processing logic gathers a training dataset, which may include a plasma exposure data and thickness profiles associated with a substrate processes using the plasma exposure data with an associated set of controlled elements. Each data item (e.g., substrate process recipe and associated with thickness profile) of the training dataset may include one or more known process rates and/or process recipe modifications.

At block 904, data items from the training dataset are input into the untrained machine learning model. At block 906, the machine learning model is trained based on the training dataset to generate a trained machine learning model that determines substrate processing rate and/or modification to substrate processing data (e.g., process recipe, plasma exposure data). The machine learning model may also be trained to output one or more other types of predictions, classifications, decisions, and so on. For example, the machine learning model may also be trained to determine substrate process rates and/or modification to plasma process recipes and performed updated substrate process with updated plasma process recipes (e.g., updated plasma exposure durations).

In one embodiment, at block 910 an input of a training data item is input into the machine learning model. The input may include plasma processing data (e.g., plasma exposure durations) and process result data (e.g., thickness profile of a substrate processed in association with the plasma processing data. The output may include a prediction and/or inference of a plasma process rate associated with controlled elements processing the substrate and/or plasma processing data modification (e.g., modification to a process recipe such as modification to plasma exposure durations associated with a set of controlled elements).

At block 914, processing logic may perform an update plasma process with updated plasma process data that incorporated the one or more plasma process data modification indicated in one or more outputs from the machine learning model. Processing a substrate using the updated plasma process data yields an updated substrate process result. Processing logic compares the updated substrate process result to a target substrate process result. At block 916, processing logic determines an error based on differences between the updated process result and the target process result. At block 918, processing logic adjusts weights of one or more nodes in the machine learning model based on the error.

At block 920, processing logic determines if a stopping criterion is met. If a stopping criterion has not been met, the method returns to block 910, and another training data item is input into the machine learning model. If a stopping criterion is met, the method proceeds to block 925, and training of the machine learning model is complete.

In one embodiment, multiple different ML models are trained to substrate process determination and/or plasma process tuning. Each of the ML models may be trained for determination and/or classification for a different type of input data. For example, a first ML model may be trained to perform process rate determination using process result data from multiple substrates processed using, a second ML model may be trained to perform process rate determination from multiple process steps associated with various operations all performed on the same substrate, and a third ML model may be trained to perform concentration determination using a combination of data used in the first ML model and the second ML model. In one embodiment, a single ML model is trained to perform the operations of the above discussed first, second and third ML models.

Figure 10:
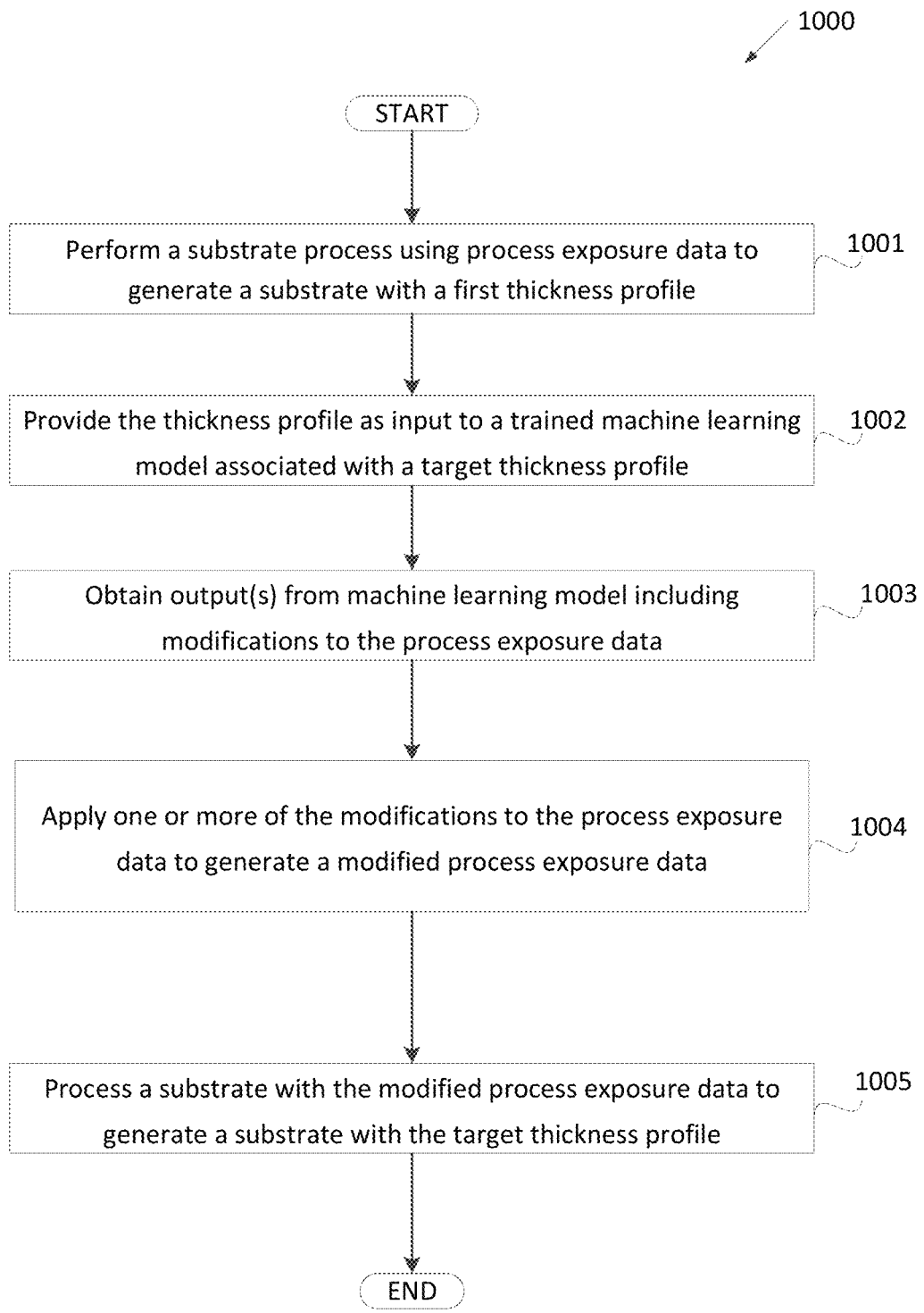
FIG. 10 is a flow chart of a method of using a machine learning model to modify a plasma exposure data, according to aspects of the disclosure.

FIG. 10 is a flow chart of a method 1000 of using a machine learning model to modify a plasma exposure data (e.g., plasma exposure durations associated with one or more zones of controlled elements to expose a substrate to plasma related fluxes), according to aspects of the disclosure. Referring to FIG. 10, at block 1001, processing logic performs a plasma process using a plasma exposure data to generate a substrate with a first thickness profile.

In an embodiment, the performing the substrate processing involving activating each zone of controlled elements only once, but the whole process time $t_p$ is divided based on the proper number of subfields and each subfield is effectively M times longer than the appropriate subfield in the previous embodiment. In this embodiment, some areas reach a target process result $k_{ij}$ earlier, and then stop, while the other areas are still processed until the whole substrate reaches a target process result (e.g., thickness).

In another embodiments, every step of a plasma process may be characterized by a fixed time. The time may be replaced by a link to the plasma exposure data, which controls the process time of each zone of controlled elements that may each have thousands of elements. The exposure data may be stored in a file such as a uniform vector (all elements identical), which can easily be created manually, when no other files, exists, or very complex and can utilized complex algorithms for the purpose of obtaining a specific process result.

At block 1002, processing logic provides the thickness profile as input to a trained machine learning model associated with a target thickness profile. The first thickness associated with processing the process exposure data. The machine learning model may be configured to reach a desired target thickness profile. The target thickness profile may be associated with specifications or properties of a substrate.

At block 1003, processing logic obtains output(s) from the machine learning model including modification to the process exposure data. The machine learning model may receive the first exposure map in various formats. For example, the process exposure data may be received by the machine learning mode as a map, array, matrix, series of values etc. indicative of plasma processing exposure instructions.

At block 1004, processing logic applies one or more of the modifications to the process exposure data to generate a modified process exposure data. In some embodiments, the modifications to the process exposure data include changing one or more exposure duration values of the exposure process exposure data.

At block 1005, processing a substrate with the modified process exposure data to generate a substrate with the target thickness profile. In some embodiments, processing the first substrate with the modified process exposure data generates a substrate with the target thickness profile. In other embodiments, processing a second substrate prior to processing with the prior process exposure data, results in the second substrate having the target thickness profile.

Figure 11:
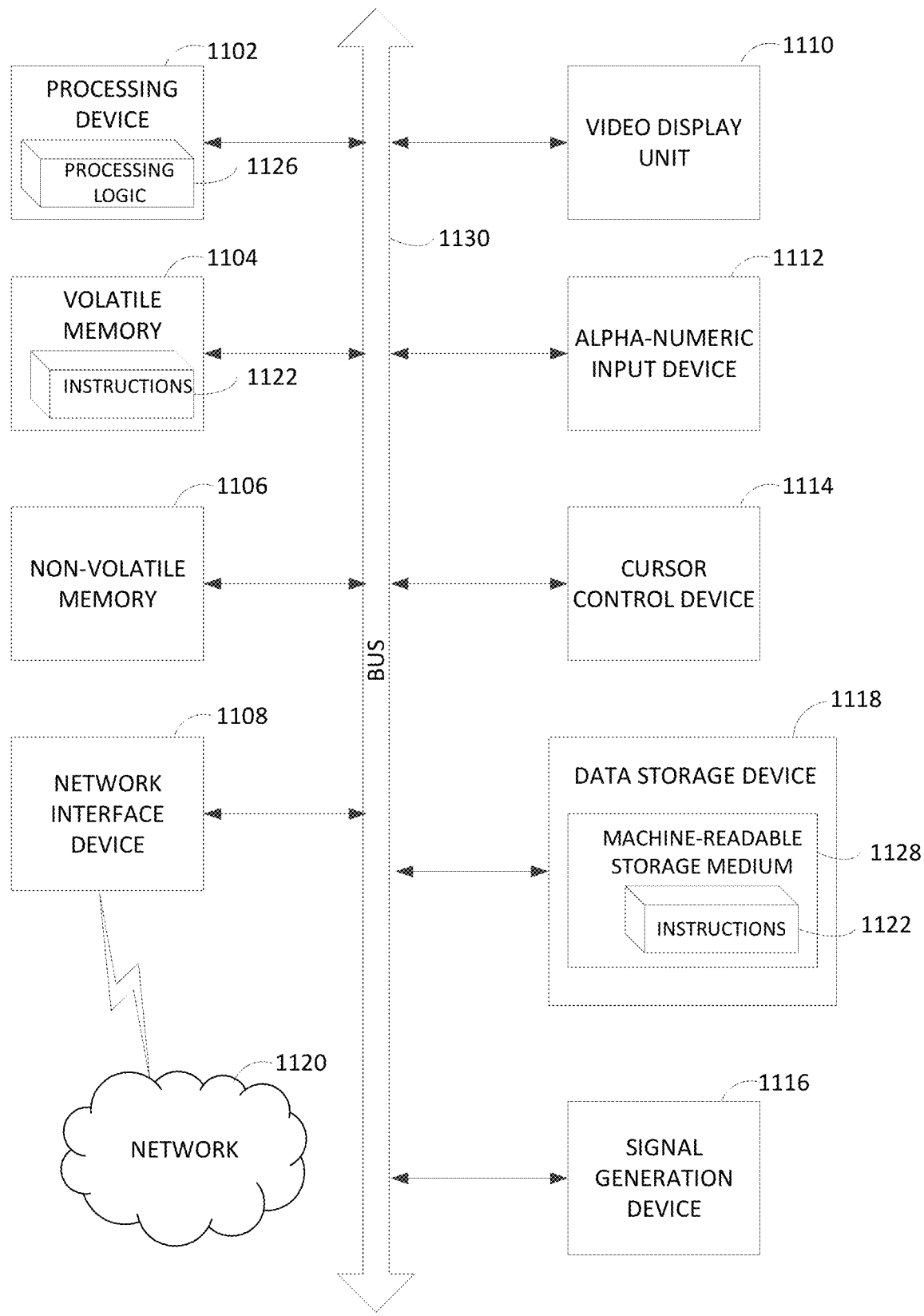
FIG. 11 depicts a block diagram of an example computing device capable of plasma delivery and/or processing, operating in accordance with one or more aspects of the disclosure.

FIG. 11 depicts a block diagram of an example computing device capable of plasma delivery and/or processing, operating in accordance with one or more aspects of the disclosure. In various illustrative examples, various components of the computing device 1100 may represent various components of a computing device, controller, and/or control panel (e.g., analogous elements described in association with FIGS. 1-5).

Example computing device 1100 may be connected to other computer devices in a local area network (LAN), an intranet, an extranet, and/or the Internet. Computing device 1100 may operate in the capacity of a server in a client-server network environment. Computing device 1100 may be a personal computer (PC), a set-top box (STB), a server, a network router, switch or bridge, or any device capable of executing a set of instructions (sequential or otherwise) that specify actions to be taken by that device. Further, while only a single example computing device is illustrated, the term "computer" shall also be taken to include any collection of computers that individually or jointly execute a set (or multiple sets) of instructions to perform any one or more of the methods discussed herein.

Example computing device 1100 may include a processing device 1102 (also referred to as a processor or CPU), a main memory 1104 (e.g., read-only memory (ROM), flash memory, dynamic random access memory (DRAM) such as synchronous DRAM (SDRAM), etc.), a static memory 1106 (e.g., flash memory, static random access memory (SRAM), etc.), and a secondary memory (e.g., a data storage device 1118), which may communicate with each other via a bus 1130.

Processing device 1102 represents one or more general-purpose processing devices such as a microprocessor, central processing unit, or the like. More particularly, processing device 1102 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. In accordance with one or more aspects of the disclosure, processing device 1102 may be configured to execute instructions implementing methods 600-1000 illustrated in FIGS. 6-10.

Example computing device 1100 may further comprise a network interface device 1108, which may be communicatively coupled to a network 1120. Example computing device 1100 may further comprise a video display 1110 (e.g., a liquid crystal display (LCD), a touch screen, or a cathode ray tube (CRT)), an alphanumeric input device 1112 (e.g., a keyboard), a cursor control device 1114 (e.g., a mouse), and an acoustic signal generation device 1116 (e.g., a speaker).

Data storage device 1118 may include a machine-readable storage medium (or, more specifically, a non-transitory machine-readable storage medium) 1128 on which is stored one or more sets of executable instructions 1122. In accordance with one or more aspects of the disclosure, executable instructions 1122 may comprise executable instructions associated with executing methods 600-1000 illustrated in FIGS. 6-10.

Executable instructions 1122 may also reside, completely or at least partially, within main memory 1104 and/or within processing device 1102 during execution thereof by example computing device 1100, main memory 1104 and processing device 1102 also constituting computer-readable storage media. Executable instructions 1122 may further be transmitted or received over a network via network interface device 1108.

While the computer-readable storage medium 1128 is shown in FIG. 13 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "returning," "comparing," "creating," "stopping," "loading," "copying," "throwing," "replacing," "performing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the disclosure also relate to an apparatus for performing the methods described herein. This apparatus may be specially constructed for the required purposes, or it may be a general purpose computer system selectively programmed by a computer program stored in the computer system. Such a computer program may be stored in a computer readable storage medium, such as, but not limited to, any type of disk including optical disks, compact disc read only memory (CD-ROMs), and magnetic-optical disks, read-only memories (ROMs), random access memories (RAMs), erasable programmable read-only memory (EPROMs), electrically erasable programmable read-only memory (EEPROMs), magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear as set forth in the description below. In addition, the scope of the disclosure is not limited to any particular programming language. It will be appreciated that a variety of programming languages may be used to implement the teachings of the disclosure.

The preceding description sets forth numerous specific details such as examples of specific systems, components, methods, and so forth, in order to provide a good understanding of several embodiments of the disclosure. It will be apparent to one skilled in the art, however, that at least some embodiments of the disclosure may be practiced without these specific details. In other instances, well-known components or methods are not described in detail or are presented in simple block diagram format in order to avoid unnecessarily obscuring the disclosure. Thus, the specific details set forth are merely exemplary. Particular implementations may vary from these exemplary details and still be contemplated to be within the scope of the disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method, comprising:
   receiving, by a processing device, data indicative of one or more plasma exposure durations of a plasma process, wherein each of the one or more plasma exposure durations is associated with a plurality of controlled elements;
   causing, by the processing device, a first plurality of controlled elements to switch between a first mode of operation and a second mode of operation, the first plurality of controlled elements to expose a first portion of a substrate to plasma related fluxes,
   wherein the first plurality of controlled elements process the substrate at an increased rate while operating in the first mode of operation relative to the second mode of operation;
   causing a second plurality of controlled elements to switch between the first mode of operation and the second mode of operation; and
   causing, by the processing device, the first plurality of controlled elements to operate in the first mode of operation for a first time duration based on the data and the second plurality of controlled elements to operate in the second mode of operation for a second time duration based on the data, wherein the first plurality of controlled elements operate in the first mode of operation at least partially simultaneously to the second plurality of controlled elements operating in the second mode of operation during a first time period.

2. The method of claim 1,
   wherein the second plurality of controlled elements to expose a second portion of the substrate to plasma related fluxes, wherein the second plurality of controlled elements process the substrate at an increased rate while operating in the first mode of operation relative to the second mode of operation.

3. The method of claim 2, wherein the first plurality of controlled elements are disposed within a first area of a control panel and the second plurality of controlled elements are disposed within a second area of the control panel, wherein the first area is surrounded by the second area.

4. The method of claim 2, wherein the first plurality of controlled elements operate in the first mode of operation at least partially simultaneous to the second plurality of controlled elements operating in the first mode of operation during a second time period, different than the first time period.

5. The method of claim 1, wherein the processing device is coupled to a power supply and the controlled elements comprise one or more plasma sources configured to receive power from the power supply and generate the plasma related fluxes.

6. The method of claim 5, wherein the processing device is coupled to matching circuitry, the matching circuitry is to maintain a first voltage level across the one or more plasma sources when the first plurality of controlled elements operates in the first mode of operation and is to maintain a second voltage level, lower than the first voltage level, across the one or more plasma sources when the first plurality of controlled elements operates in the second mode of operation.

7. The method of claim 5, wherein the processing device is coupled to one or more gas injection valves, wherein causing a second plurality of controlled elements to switch between the first mode of operation and the second mode of operation is associated with opening or closing the one or more gas injection valves.

8. The method of claim 5, wherein the plurality of controlled elements comprise a first set of linear electrodes coupled to a first terminal of the power supply and a second set of linear electrodes coupled to a second terminal of the power supply, the method further comprising:
   causing, by the processing device, one of the first set of linear electrodes and one of the second set of linear electrodes to discharge the plasma related fluxes, wherein the one or more linear electrodes are to process the substrate along a first axis parallel to a surface of the substrate.

9. The method of claim 8, further comprising rotating the substrate about a second axis perpendicular to the surface of the substrate.

10. The method of claim 1, wherein the first plurality of controlled elements comprises one or more of a plasma shutter, a bias electrode, or a heat source.

11. A system, comprising:
   a processing chamber;
   a plurality of controlled elements disposed within the processing chamber, the plurality of controlled elements to expose a surface of a substrate disposed within the processing chamber to plasma related fluxes;
   a processing device, communicatively coupled to the plurality of controlled elements and configured to control the plurality of controlled elements, to:
      receive data indicative of one or more plasma exposure durations of a plasma process, wherein each of the one or more plasma exposure durations is associated with a plurality of controlled elements;
      cause a first selection of the plurality of controlled elements to switch between a first mode of operation and a second mode of operation, the first selection of the plurality of controlled elements to expose a first portion of the surface of the substrate to the plasma related fluxes, wherein the first selection of the plurality of controlled elements processes the substrate at an increased rate while operating in the first mode of operation relative to the second mode of operation;
      cause a second plurality of controlled elements to switch between the first mode of operation and the second mode of operation; and
      cause the first selection of the plurality of controlled elements to operate in the first mode of operation for a first time duration based on the data and the second plurality of controlled elements to operate in the second mode of operation for a second time duration based on the data, wherein the first plurality of controlled elements operate in the first mode of operation at least partially simultaneously to the second plurality of controlled elements operating in the second mode of operation during a first time period.

12. The system of claim 11,
   wherein the second selection of the plurality of controlled elements to expose a second portion of the surface of the substrate to the plasma related fluxes.

13. The system of claim 11, wherein the processing device is coupled to a power supply and the controlled elements comprise one or more plasma sources to receive power from the power supply and generate the plasma related fluxes.

14. The system of claim 13, wherein the power supply is coupled to matching circuitry, the matching circuitry to maintain a first voltage level across the one or more plasma sources when the first plurality of controlled elements operates in the first mode and is to maintain a second voltage level, less than the first voltage level, across the one or more plasma sources when the first selection of the plurality of controlled elements operates in the second mode.

15. The system of claim 13, wherein the processing device is coupled to one or more gas injection valves, wherein to cause a second plurality of controlled elements to switch between the first mode of operation and the second mode of operation comprises at least one of opening or closing the one or more gas injection valves.

16. The system of claim 13, wherein the first plurality of controlled elements comprises a first set of linear electrodes coupled to a first terminal of the power supply and a second set of linear electrodes coupled to a second terminal of the power supply, wherein the processing device is further to cause one of the first set of linear electrodes and one of the second set of linear electrodes to discharge the plasma related fluxes, wherein the one or more linear electrodes are to process the substrate along a first axis parallel to a surface of the substrate.

17. A method, comprising:
receiving, by a processing device, data indicative of one or more plasma exposure durations each associated with a plurality of controlled elements configured to expose a substrate to plasma related fluxes associated with a plasma process;
receiving, by the processing device, a first thickness profile of the substrate, the first thickness profile comprising a first plurality of process result thickness values of the substrate measured after exposing the substrate to the plasma related fluxes associated with a first plurality of controlled elements operating in a first mode of operation for a first plasma exposure duration;
determining, by the processing device, a first plurality of substrate processing rates associated with one of more locations across a surface of the substrate corresponding to the plurality of controlled elements operating in the first mode of operation; and
responsive to determining the first plurality of substrate processing rates, modifying, by the processing device, the data by changing one of the one or more plasma exposure durations.

18. The method of claim 17, further comprising:
receiving, by the processing device, a second thickness profile of the substrate, the second thickness profile comprising a second plurality of process result thickness values of the substrate measured after exposing the substrate to the plasma related fluxes associated with a first plurality of controlled elements operating in a second mode of operation for a second plasma exposure duration, wherein the first plurality of controlled elements process the substrate at an increased rate while operating in the first mode of operation relative to the second mode of operation;
determining a second plurality of substrate processing rates associated with the one or more locations across the surface of the substrate corresponding to the plurality of controlled elements operating in the second mode of operation, wherein the data is modified further responsive to determining the second plurality of substrate processing rates.

19. The method of claim 17, further comprising:
receiving, by the processing device, a third thickness profile of the substrate, the third thickness profile comprising a third plurality of process result thickness values of the substrate measured after exposing the substrate to the plasma related fluxes associated with a second plurality of controlled elements operating in the first mode for a third plasma exposure duration; and
determining, by the processing device, a third plurality of substrate processing rates associated with the one or more locations across the surface of the substrate corresponding to the second plurality of controlled elements operating in the first mode, wherein the data is modified further responsive to determining the third plurality of substrate processing rates.

20. The method of claim 17, further comprising:
using the data and the first thickness profile as input to a machine learning model; and
obtaining one or more outputs of the machine learning model, the one or more outputs indicating a modification to the one or more plasma exposure durations.

* * * * *